(12) United States Patent
Ishimine

(10) Patent No.: US 7,522,418 B2
(45) Date of Patent: Apr. 21, 2009

(54) ELECTRONIC EQUIPMENT AND RACK APPARATUS

(75) Inventor: Junichi Ishimine, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/878,777

(22) Filed: Jul. 26, 2007

(65) Prior Publication Data

US 2008/0068793 A1    Mar. 20, 2008

(30) Foreign Application Priority Data

Sep. 19, 2006   (JP)   ............................. 2006-252938

(51) Int. Cl.
   *H05K 7/20*   (2006.01)
(52) U.S. Cl. ...................... 361/699; 361/688; 165/80.4
(58) Field of Classification Search ......... 361/687–690, 361/695, 699, 719; 165/122, 80.4, 243, 247, 165/104.33; 713/300; 318/461; 62/178, 62/180, 229
See application file for complete search history.

(56) References Cited

U.S. PATENT DOCUMENTS

| | | | | |
|---|---|---|---|---|
| 6,166,907 | A * | 12/2000 | Chien .......................... | 361/699 |
| 6,385,510 | B1 * | 5/2002 | Hoog et al. .................. | 700/276 |
| 6,487,463 | B1 * | 11/2002 | Stepp, III ...................... | 700/79 |
| 7,272,945 | B2 * | 9/2007 | Bash et al. ..................... | 62/180 |
| 2005/0241810 | A1 * | 11/2005 | Malone et al. ............... | 165/122 |
| 2006/0161311 | A1 * | 7/2006 | Vinson et al. ............... | 700/300 |
| 2007/0101173 | A1 * | 5/2007 | Fung .......................... | 713/300 |

FOREIGN PATENT DOCUMENTS

| | | |
|---|---|---|
| JP | 06-34220 | 5/1994 |
| JP | 08-063261 | 3/1996 |
| JP | 3068892 | 3/2000 |
| JP | 2004-363308 | 12/2004 |

* cited by examiner

*Primary Examiner*—Boris L Chervinsky
*Assistant Examiner*—Courtney L Smith
(74) *Attorney, Agent, or Firm*—Staas & Halsey LLP

(57) ABSTRACT

An electronic equipment has a heat-generating part therein. A housing accommodates component parts including the heat-generating part. A cooling-medium circulation system circulates a liquid internal cooling-medium between a heat-absorbing part and a heat-radiating part, the heat-absorbing part absorbing heat from the heat-generating part, the heat-radiating part radiating the heat absorbed by the heat-absorbing part. The heat-radiating part of the cooling-medium circulation system includes a first heat exchanger that performs heat exchange between a liquid external cooling-medium and the internal cooling-medium, the external cooling-medium being supplied from outside the electronic equipment, and a second heat exchanger that performs heat exchange between an air and said internal cooling-medium, the air being exhausted from the housing to outside.

19 Claims, 16 Drawing Sheets

ELECTRONIC EQUIPMENT AND RACK APPARATUS

BACKGROUND OF THE INVENTION

1. Field of the Invention

The present invention generally relates to electronic equipments and, more particularly, to an electronic equipment having a heat exchanger for cooling internal parts and a rack apparatus in which such an electronic equipment is accommodated.

2. Description of the Related Art

In recent years, it is common to arrange many electric equipments in a rack having many stages so as to constitute a server or the like and install the rack in a room having air-conditioner (hereinafter, referred to as an air-conditioned room). A relatively high-temperature air generated when cooling internal parts of electronic equipments is exhausted from the housing of the electronic equipment. Many electronic equipments are accommodated in the rack, and if a plurality of such racks are installed in an air-conditioned room, a large amount of high-temperature air is discharged from the racks into the air-conditioned room. The temperature of the air-conditioned room in which the racks are installed is maintained constant at a normal temperature such as, for example, 20° C.

FIG. 1 is an illustration showing circulation of air around racks by air-conditioners. Normally, an air-conditioned room, in which racks 2 are installed, is provided with openings in a floor 4 and a ceiling so that cool air is supplied from floor openings 4a into the air-conditioned room and warm air is taken from openings of the ceiling (not shown in the figure) and suctioned into air-conditioners 6. The warm air discharged from the racks 3 is cooled by the air-conditioners 6, and, then, supplied into the air-conditioned room through the openings 4a of the floor 4. Normally, many openings 4a are provided around the racks 2 generating a large amount of heat so as to provide a well-balanced air conditioning in the air-conditioned room.

However, if many racks 2 are installed in a limited part of the area of the air-conditioned room, there may be a case where a temperature around the racks 2 becomes higher than a temperature of other areas in the air-conditioned room, which generates a heat spot where a temperature is raised locally. Additionally, if an amount of heat discharged from the racks 2 exceeds a capacity of the air-conditioners 6, it is difficult to maintain the temperature of the entire air-conditioned room constant.

Thus, there is suggested a cooling system in which a liquid-cooling type heat exchanger is provided in a rack and an internal part of each electronic equipment is liquid-cooled so as to achieve heat exchange with a cooling medium from each electronic equipment by a heat exchanger in the rack (for example, refer to Patent Document 1). In this cooling system, although heat generated by each electronic equipment is absorbed temporarily by the cooling medium, the absorbed heat is released to air in the rack and discharged to outside the rack. Thus, finally, the heat from the electronic equipments is discharged from rack to the air-conditioned room.

Moreover, there is suggested a technique to circulate air inside an electronic apparatus while cooling by providing a refrigerating machine and a heat exchanger of a cooling side in the electronic apparatus and arranging a heat exchanger of a radiation side outside the electronic apparatus (for example, refer to Patent Document 2). In this case, if the heat exchanger of the radiation side is in the air-conditioned room, whole heat from the electronic apparatus is discharged into the air-conditioned room.

Moreover, there is suggested an induction equipment in which a nonflammable insulating liquid filled in an insulated container is forcibly circulated through a heat exchanger by providing the heat exchanger in a dead space inside a tank and locating a liquid delivery pump outside the tank, and the heat exchange by the heat exchanger is achieved by causing a cooling medium to flow through an external cooling medium pipe from outside the tank so as to cool an iron core inside (for example, refer to Patent Document 3). In this case, since the cooling medium circulating in the induction equipment as an electronic apparatus is cooled by the cooling medium circulating outside the induction equipment, heat in the induction equipment can be taken out of the induction equipment, but if the radiation of heat from the cooling medium circulating outside the induction equipment is in an air-conditioned room, whole heat from the electronic apparatus is radiated into the air-conditioned room.

Moreover, there is suggested a CPU heat-radiation apparatus for cooling a CUP by providing a liquid-cooling type cooling unit to a CPU inside an electronic apparatus and circulating a cooling medium between the liquid-cooling type cooling unit and an air-cooling type cooling unit (for example, refer to Patent Document 4). In this CPU heat-radiation apparatus, the cooling medium circulates in the electronic apparatus, and the whole heat generated from the CPU is finally radiated into an air-conditioned room.

Thus, in order to cool a comparatively high-temperature air discharged from the rack 2, there is a suggestion to provide a water-cooling type heat exchanger in the rack 2 so as to discharge air of which temperature is decreased to a certain level from the rack 2. FIG. 2 is an illustration of the rack 2 provided with a water-cooling type heat exchanger 8. A plurality of electronic equipments 10 are accommodated in the rack 2. High-temperature air exhausted from the electronic equipments 10 is cooled by the water-cooling type heat exchanger 8 and turned to a low-temperature air and exhausted to outside the rack 2. A cooling-water is supplied to the water-cooling type heat exchanger 8 from outside through a cooling-water pipe 12A. The supplied cooling-water absorbs heat from the high-temperature air from the electronic equipments 10, and is discharged to outside through a cooling-water pipe 12B. Although not shown in the figure, the high-temperature cooling water discharged by the cooling-water pipe 12B is cooled by a cooling machine provided outside the air-conditioned room where the rack 2 is installed, and turned into a low-temperature cooling water and is supplied again to the cooling-water pipe 12A.

As mentioned above, by providing the water-cooling type heat exchanger 8, the temperature of the air exhausted from the rack 2 can be decreased. The heat absorbed from the air exhausted from the rack 2 is transported by the cooling-water, and radiated outside the air-conditioned room. Accordingly, the heat absorbed by the heat exchanger 8 is not radiated into the air-conditioned room, thereby reducing a load of the air-conditioning machine for air-conditioning the air-conditioned room. Additionally, by providing the heat exchanger 8 to the rack generating especially a large amount of heat, a heat spot is prevented from being generated in the air-conditioned room.

Patent Document 1: Japanese Laid-Open Patent Application No. 2004-363308

Patent Document 2: Japanese Laid-Open Patent Application No. 8-63261

Patent Document 3: Japanese Laid-Open Utility Model Application No. 6-34220

Patent Document 4: Japanese Utility Model Registration No. 3068892

As mentioned above, if the water-cooling type heat exchanger 8 is provided to the rack 2, heat exchange from a solid (heat-generating parts) to a gas (air) is performed inside the electronic equipment 10. When the air absorbed heat is exhausted from the electronic equipment 10, heat exchange from a gas (air) to a solid (fins of the heat exchanger) is performed in the water-cooling type heat exchanger 8 in the rack 2 and the air from the electronic equipment 10 is cooled and exhausted to outside the rack 2.

Generally, an efficient of heat transfer between solid and gas is lower than an efficient of heat transfer between solid and liquid. Considering an area needed to transfer the same amount of heat in an example of air and water, air requires an area ten to hundred times an area of water. In the example shown in FIG. 2, the heat generated in the electronic equipment 10 is exhausted to outside the air-conditioned room by performing the low-efficient solid-gas heat transfer two times. Accordingly, it is desirous to develop a technique which can efficiently discharge heat from an electronic equipment to outside an air-conditioned room.

SUMMARY OF THE INVENTION

It is a general object of the present invention to provide an improved and useful electronic equipment and rack apparatus in which the above-mentioned problems are eliminated.

A more specific object of the present invention is to provide an electronic equipment and rack apparatus which can efficiently discharge heat to outside an air-conditioned room.

In order to achieve the above-mentioned objects, there is provided according to one aspect of the present invention an electronic equipment having a heat-generating part therein, the electronic equipment comprising: a housing accommodating component parts including the heat-generating part; and a cooling-medium circulation system for circulating a liquid internal cooling-medium between a heat-absorbing part and a heat-radiating part, the heat-absorbing part absorbing heat from the heat-generating part, the heat-radiating part radiating the heat absorbed by the heat-absorbing part, wherein the heat-radiating part of the cooling-medium circulation system includes:

a first heat exchanger that performs heat exchange between a liquid external cooling-medium and the internal cooling-medium, the external cooling-medium being supplied from outside the electronic equipment; and a second heat exchanger that performs heat exchange between an air and the internal cooling-medium, the air being exhausted from the housing to outside.

In the electronic equipment according to the present invention, a fan may be provided in a vicinity of the second heat exchanger so that air inside the housing is exhausted to outside the housing by the fan. The heat-absorbing part of the cooling-medium circulation system may be a heat sink provided to the heat-generating part. The first heat exchanger may be arranged along a path of the internal cooling-medium and between the heat-absorbing part and the second heat exchanger.

The electronic equipment according to the present invention may further comprise: a fan arranged in a vicinity of the second heat exchanger so as to exhaust air inside the housing to outside the housing; an air-temperature detector detecting a temperature of the air inside the housing so as to generate an air-temperature detection signal; a cooling-medium temperature detector detecting a temperature of the internal cooling-medium of the cooling-medium circulation system so as to generated a cooling-medium temperature detection signal; and a control part controlling an amount of air flow of the fan based on the air-temperature detection signal and the cooling-medium temperature detection signal. The control part may control the amount of air flow of the fan when a difference between a temperature of the internal cooling-medium at a position between the first heat exchanger and the second heat exchanger and a temperature detected by the air-temperature detector exceeds a predetermined threshold value, and the control part may stops the fan when the difference is equal to or smaller than the threshold value.

The electronic equipment according to the present invention may further comprise: a flow meter detecting an amount of flow of the external cooling-medium so as to generate a flow detection signal; a fan arranged in a vicinity of the second heat exchanger so as to exhaust the air inside the housing to outside the housing; and a control part controlling an amount of air flow of the fan based on the flow detection signal.

In the electronic equipment according to the present invention, a fluid coupling may be provided to an external cooling-medium pipe for supplying or discharging the external cooling-medium to or from the first heat exchanger. An open and close valve may be provided to an external cooling-medium pipe for supplying or discharging the external cooling-medium to or from the first heat exchanger. A relief valve may be provided between an external cooling-medium pipe for supplying the external cooling-medium to the first heat exchanger and an external cooling-medium pipe for discharging the external cooling-medium from the first heat exchanger.

The electronic equipment according to the present invention may further comprise: an electromagnetic open and close valve provided to an external cooling-medium pipe for supplying or discharging the external cooling-medium to or from the first heat exchanger; and a control part controlling opening and closing of the electromagnetic open and close valve.

In the electronic equipment according to the present invention, a short-circuit passage for short-circuiting between a pipe for supplying the internal cooling-medium to the first heat exchanger and a pip for discharging the internal cooling-medium from the first heat exchanger, and an open and close mechanism is provided to open and close the short-circuit passage. The open and close mechanism may include an open and close valve incorporated in the short-circuit passage. The open and close valve may be an electromagnetic open and close valve. The short-circuit passage may have a tube having elasticity, and a blocking member is attached to the first heat exchanger, the blocking member configured to block off the short-circuit passage by pressing and squashing the tube. The first heat exchanger may be detachably attached using a fluid coupling. The first heat exchanger may be detachably attached using a fluid coupling.

Additionally, there is provided according to another aspect of the present invention a rack apparatus comprising: a rack; and at least one electronic equipment accommodated in the rack, wherein the electronic equipment has a heat-generating part therein and includes: a housing accommodating component parts including the heat-generating part; and a cooling-medium circulation system for circulating a liquid internal cooling-medium between a heat-absorbing part and a heat-radiating part, the heat absorbing part absorbing heat from the heat-generating part, the heat-radiating part radiating the heat absorbed by the heat-absorbing part, wherein the heat-radiating part of the cooling-medium circulation system includes:

a first heat exchanger that performs heat exchange between a liquid external cooling-medium and the internal cooling-medium, the external cooling-medium being supplied from outside the electronic equipment; and a second heat exchanger that performs heat exchange an air and the internal cooling-medium, the air being exhausted from the housing to outside.

Further, there is provided according to another aspect of the present invention a rack apparatus comprising: an electronic equipment having a heat-generating part therein; and a liquid-liquid type heat exchanger configured to be connectable to the electronic equipment, a liquid external cooling-medium being supplied from outside, wherein the electronic equipment includes: a housing accommodating component parts including the heat-generating part; and a cooling-medium circulation system for circulating a liquid internal cooling-medium between a heat-absorbing part and a heat-radiating part, the heat absorbing part absorbing heat from the heat-generating part, the heat-radiating part radiating the heat absorbed by the heat-absorbing part, wherein the heat-radiating part of the cooling-medium circulation system includes a gas-liquid type heat exchanger that performs heat exchange between air exhausted from the housing to outside and the internal cooling-medium.

According to the present invention, the first heat exchanger is a liquid-liquid type heat exchanger in which heat is transferred through a path of liquid (internal cooling-medium)→solid→liquid, and has a higher cooling efficiency that the second heat exchanger in which heat is transferred through a path of liquid (internal cooling-medium)→solid→gas (air). Thus, the first heat exchanger can efficiently radiate heat to outside. Accordingly, the cooling efficiency as a whole cooing apparatus by the internal cooling-medium can be improved and raised.

Moreover, the external cooling-medium that absorbed heat generated in the electronic equipment through the internal cooling-medium can be transferred to a heat exchanger installed outside the air-conditioned room through the external cooling-medium, and the heat can be radiated at the heat exchanger outside the air-conditioned room. Accordingly, heat generated inside the electronic equipment is not radiated into the air-conditioned room, and, thereby, an air-conditioning load to the air-conditioned room can be reduced.

Further, the electronic equipment according to the present invention can be installed as an air-cooling apparatus when the electronic equipment is installed in an environment in which the external cooling-medium is not available. Thus, the electronic equipment, which can be installed irrespective of availability of the external cooling-medium, can be provided.

Other objects features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

Figure 1:
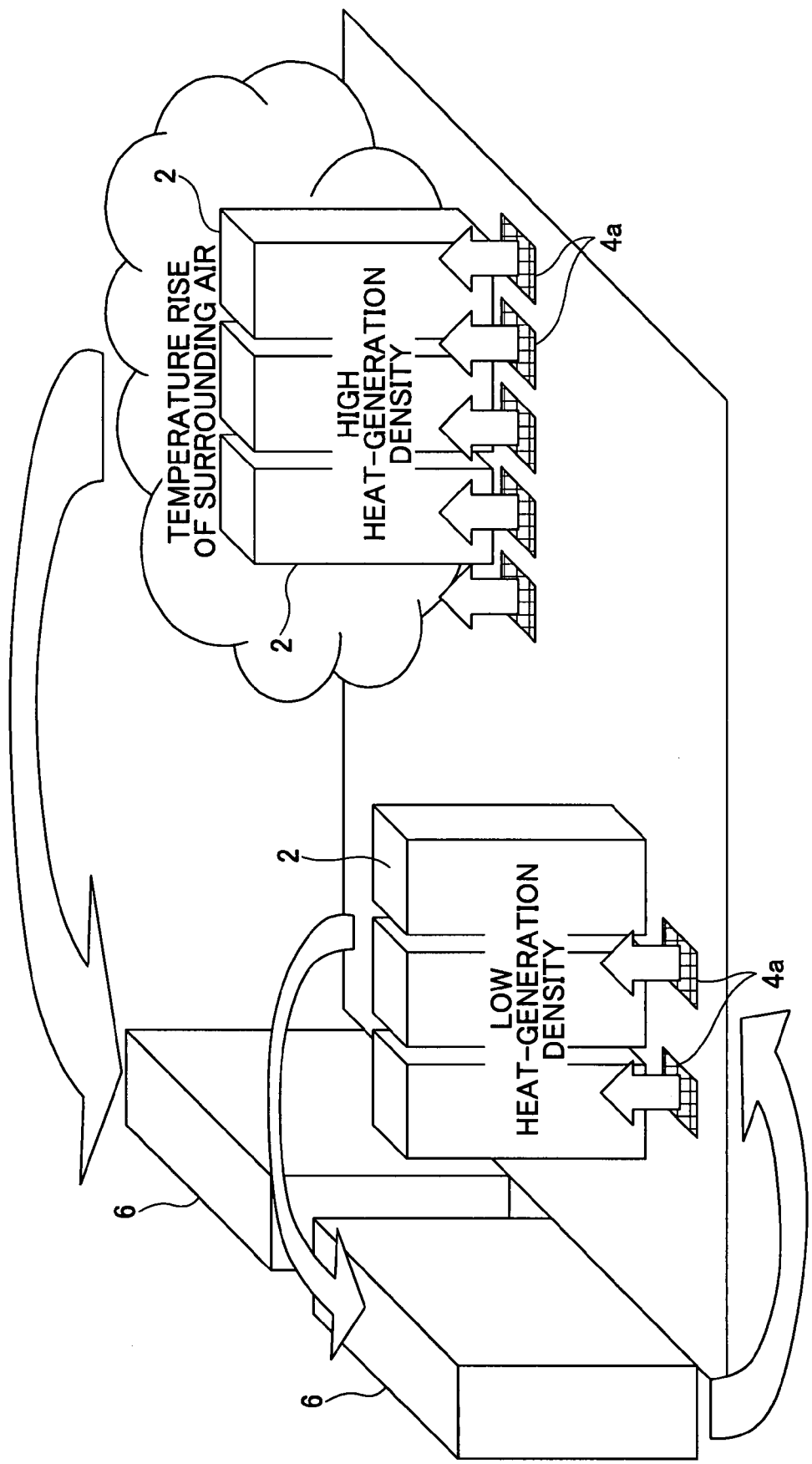
FIG. 1 is an illustration showing circulation of air around a rack by an air-conditioning machine.
Figure 2:
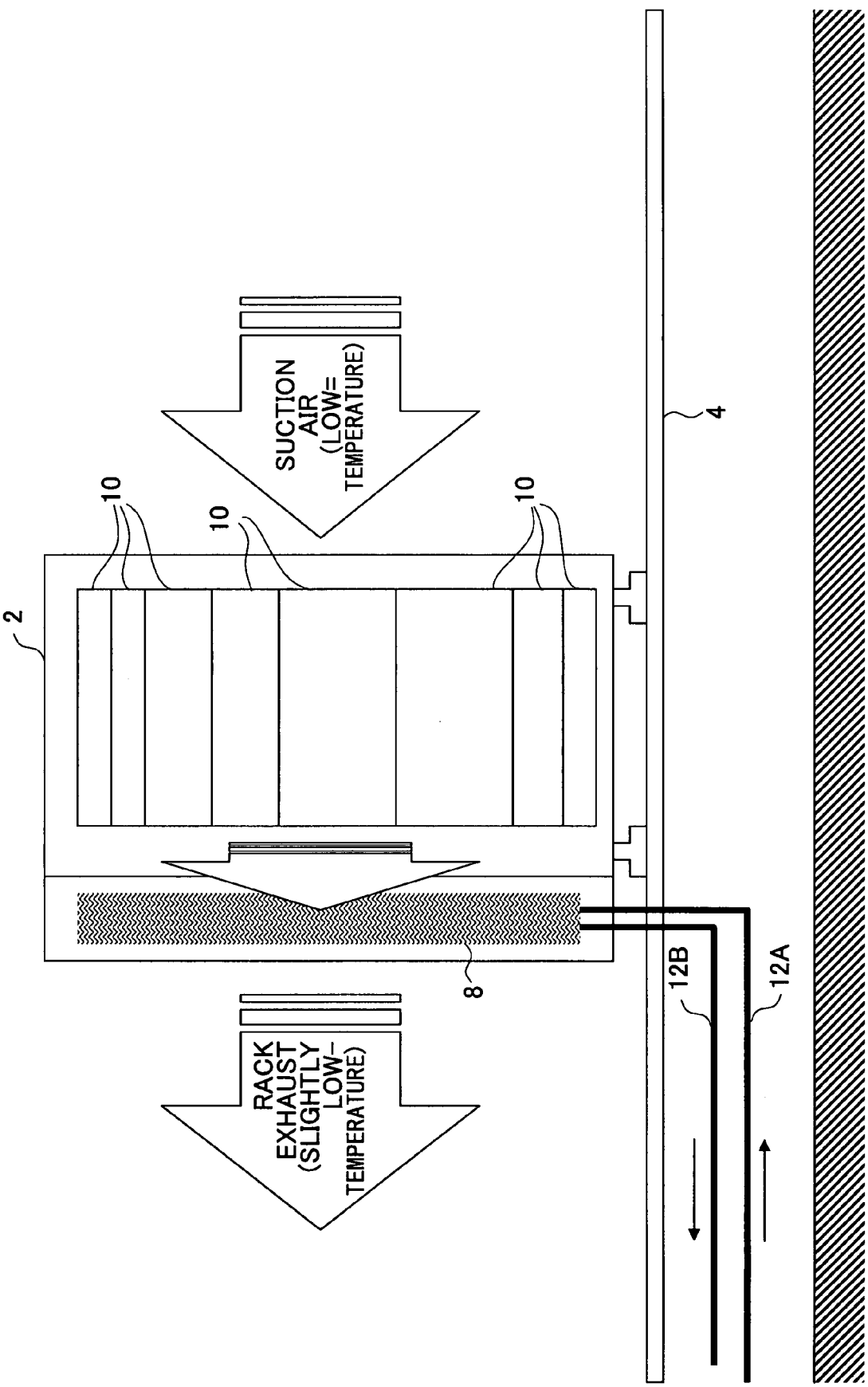
FIG. 2 is an illustration of a rack provided with a water-cooling type heat exchanger.
Figure 3:
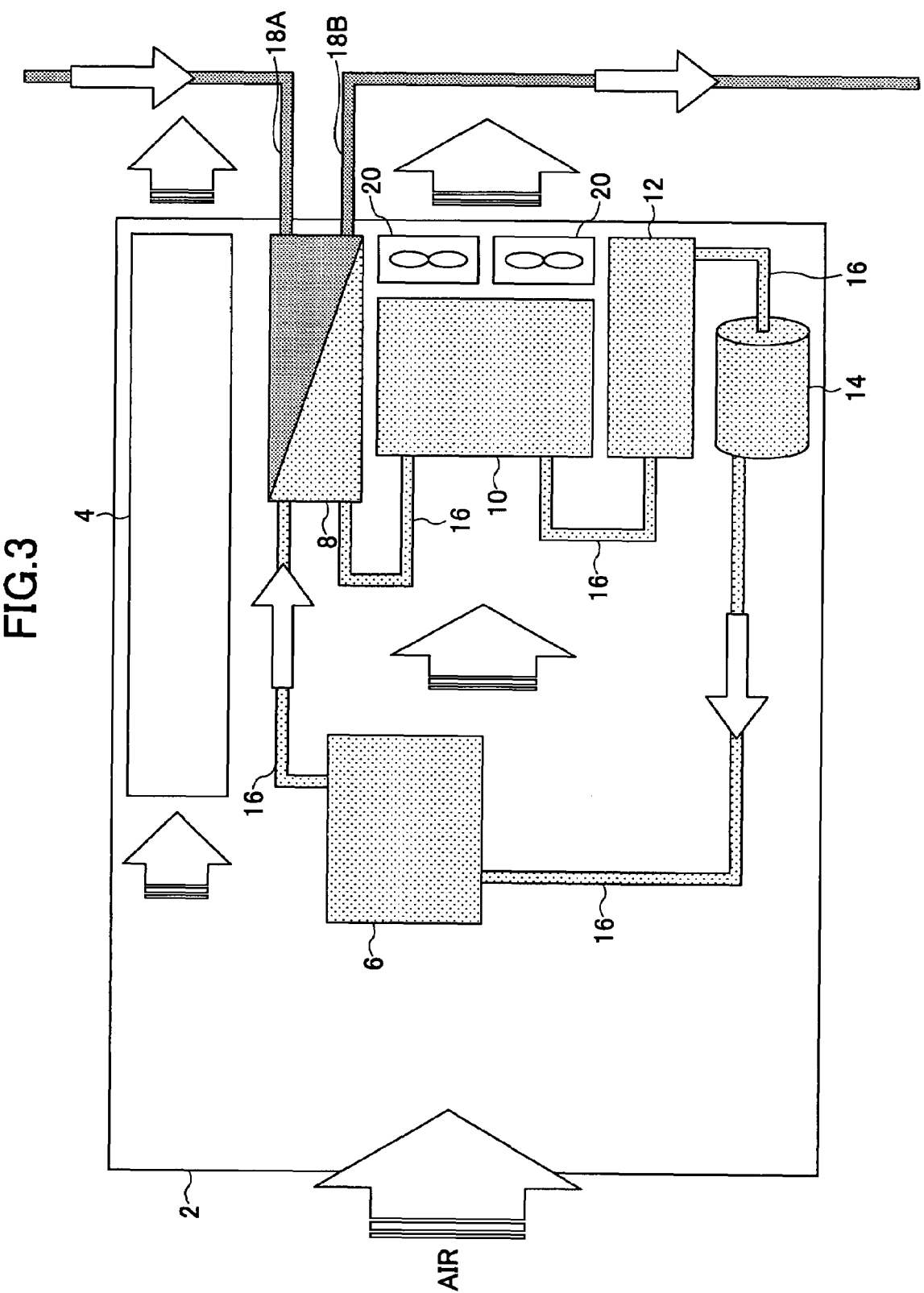
FIG. 3 is a plan view showing an outline of an electronic equipment according to a first embodiment of the present invention.

FIG. 3 is a plan view showing an outline of an electric equipment according to a first embodiment of the present invention. The electric equipment according to the first embodiment of the present invention has electronic parts and electric parts accommodated in a housing 2. As the electronic parts, there is, for example, a semiconductor device such as a CPU, and as the electric parts, there is, for example, a power supply unit 4 that supplies an electric power to the electronic parts. Since a semiconductor device such as a CPU generates heat during operation, a cooling device is provided to the semiconductor device in many cases. Additionally, a fan is provided in the housing 2 in many cases so as to discharge heat from the electronic parts and the electric parts to outside, the fan introducing air outside the hosing 2 into the housing 2 and exhausting warm air in the housing 2 to outside the housing 2.

In the present embodiment, in order to cool the semiconductor device such as a CPU as an electronic part, there is provided a liquid-cooling type cooling device. The liquid-cooling type cooling device is constituted by a cooling-medium circulation system for circulating electronic parts to circulate liquid cooling-medium between a heat-absorbing part and a heat-radiating part so as to absorb heat from electronic parts by the cooling-medium and radiate the heat at the heat-radiating part.

The cooling-medium circulation system comprises a heat sink 6 which is a heat-absorbing part, a first heat exchanger 8 which is a heat-radiating part, a second heat exchanger 10 which is a heat-radiating part, a tank 12 for storing liquid cooling-medium, a pump 14 for circulating the cooling-medium, and a cooling-medium pipe 16 which connects those component parts to serve as a circulation passage. The tank 12 may be provided if needed.

The cooling-medium discharged from the pump 14 is first passed through the pipe 16 and supplied to the heat sink 6. The heat sink 6 is attached to an electronic part to be cooled, and heat generated in the electronic part is absorbed by the liquid cooling-medium being circulating. The cooling-medium flows from the heat sink 6 to the first heat exchanger 8 through the pipe 16.

The first heat exchanger 8 is a liquid-liquid type heat exchanger, and is configured so that heat exchange is performed between the liquid cooling-medium (hereinafter, may be referred to as an internal cooling-medium) from the heat sink 6 and the liquid cooling-medium (hereinafter, may be referred to as an external cooling-medium) supplied from outside of the electric equipment. The external cooling-medium is a low-temperature cooling-medium, which is supplied to the first heat exchanger 8 through an external cooling-medium pipe 18A and is discharged from the first heat exchanger 8 through an external cooling-medium pipe 18B. The external cooling-medium is a relatively low-temperature liquid cooling-medium, which can absorb heat from the internal cooling-medium.

The internal cooling-medium, which radiated heat by the heat exchange in the first heat exchanger 8 and turned to be at a low temperature in certain degree, is supplied to the second heat exchanger 10 through the pipe 16. The second heat exchanger 10 is a gas-liquid type heat exchanger, and is configured to perform heat exchange between the internal cooling-medium and a surrounding air. A fan 20, which is a blower, is arranged in the vicinity of the second heat exchanger 10 so as to exhaust the air inside the housing 2 including surrounding area of the second heat exchanger 10 to outside the housing 2. According to the heat exchange in the second heat exchanger 10, the internal cooling-medium radiates the heat to the surrounding air so as to be at a lower temperature.

The internal cooling-medium turned to be a low temperature in the second heat exchanger 10 is temporarily stored in the tank 12, and, thereafter, pressurized by the pump 14 and supplied again to the heat sink 6. As mentioned above, the internal cooling-medium discharges the heat absorbed in the heat sink 6 to the outside of the electronic equipment through the first and the second heat exchangers 8 and 10 while circulating through between the heat sink 6, which is a heat-absorbing part, the first heat exchanger 8 (liquid-liquid type), which is a heat-radiating part, and the second heat exchanger 10 (gas-liquid type), which is a heat-radiating part.

As mentioned above, in the present embodiment, a part of heat which the internal cooling-medium absorbed in the heat sink 6 is radiated at the first heat exchanger 8, and the rest of the heat is radiated at the second heat exchanger 10. Thus, an amount of heat radiated to the air at the second heat exchanger 10 and exhausted to outside surrounding area of the electronic equipment as being warmed air can be reduced.

When there is a small amount of heat to be absorbed at the heat sink 6 (that is, an amount of heat generated by the electronic part is small), there may be a case where most heat is radiated by the first heat exchanger 8 and there is little amount of heat to be radiated at the second heat exchanger 10. Contrarily, when an amount of heat to be absorbed by the heat sink 6 is large (that is, an amount of heat generated by the electronic part is large), a large amount of heat can be radiated by radiating the heat by the first and second heat exchangers 8 and 10 bearing part of the radiation.

Here, the first heat exchanger 8 is a heat exchanger of a liquid-liquid type in which heat is transferred along a path of liquid (internal cooling-medium)→solid→liquid (external cooling-medium), and has a higher cooling efficiency than the second heat exchanger 10 and capable of radiating heat to outside with good efficiency. Accordingly, the cooling efficiency as the whole cooling device by the internal cooling-medium can be improved and raised.

Here, the air containing the heat radiated at the second heat exchanger 10 is exhausted by the fan 2 to outside the housing 2 of the electronic equipment. That is, the heat radiated at the second heat exchanger 10 is radiated to the surrounding area of the electronic equipment. On the other hand, the heat radiated to the external cooling-medium at the first heat exchanger 8 can be transported by the external cooling-medium, and can be radiated at a place distant from the electronic equipment. For example, when the electronic equipment is provided in the air-conditioned room, heat of the electronic equipment can be radiated at outside the air-conditioned room by extending the external cooling-medium pipe to outside the air-conditioned room.

Figure 4:
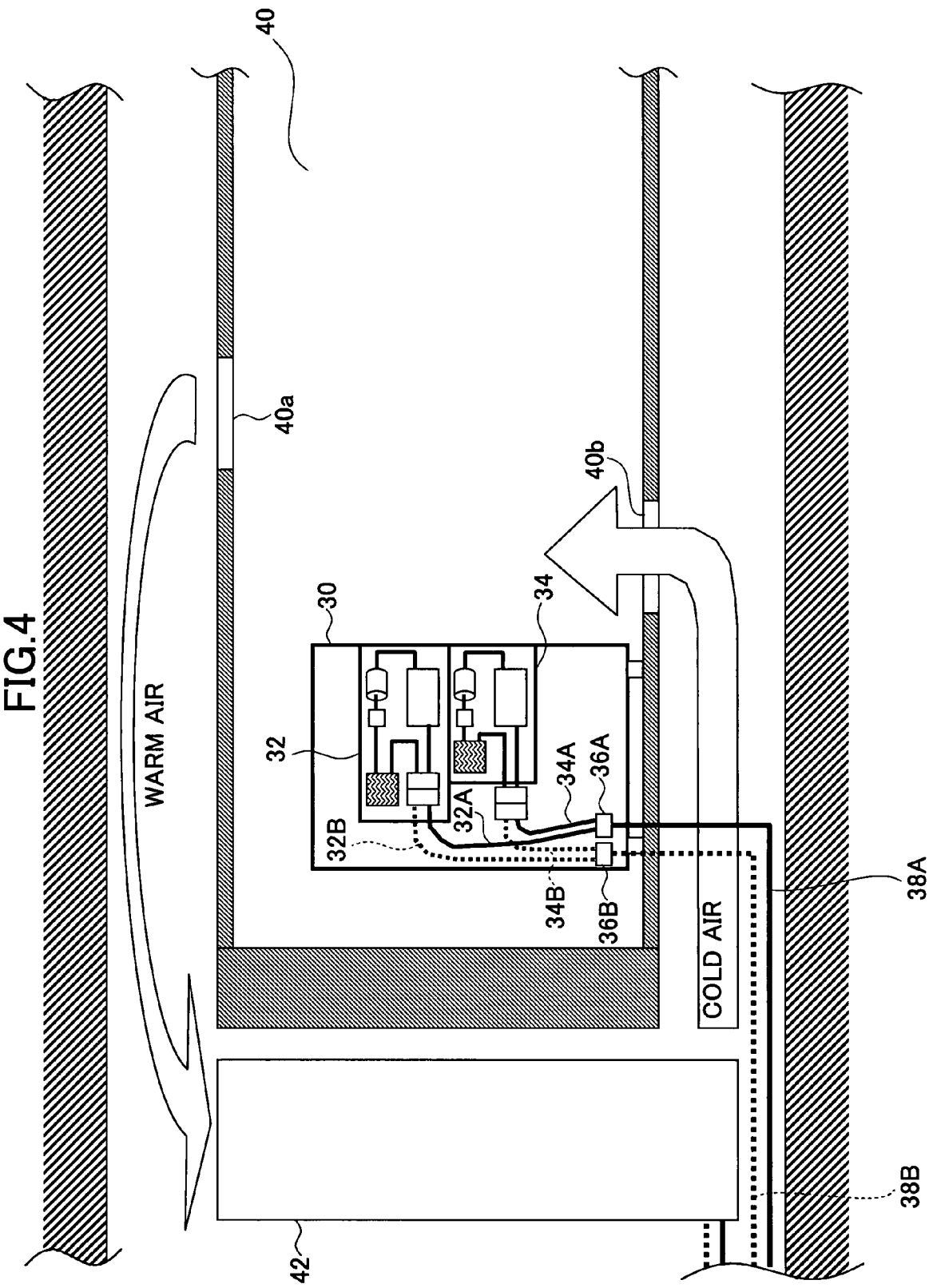
FIG. 4 is an illustration showing a state where a rack in which the electronic equipments shown in FIG. 3 are accommodated is installed in an air-conditioned room.

FIG. 4 is an illustration showing a state where a rack accommodating electronic equipments shown in FIG. 3 is installed in an air-conditioned room. In FIG. 4, the rack 30, which is a rack apparatus, if installed in the air-conditioned room 40 provided with air conditioning such as a computer room. Air inside the air-conditioned room 40 is subjected to temperature adjustment by an air-conditioning machine 42 installed outside the air-conditioning room 40, and is returned to the air-conditioned room 40. That is, the warm air exhausted from the electronic equipment 32 in the rack 30 is suctioned by the air-conditioning machine 42 through a ceiling opening 40a, and the temperature thereof is decreased to be cold air, and supplied to the air-conditioned room 40 through a floor opening 40b of the air-conditioned room 40. Thereby, the temperature in the air-conditioned room 40 is maintained at a constant temperature (for example, 23° C.).

Here, external cooling-medium pipes 32A and 34A (corresponding to the external cooling-medium pipe 18A of FIG. 3) for supplying the external cooling-medium to the electronic equipments 32 and 34 in the rack 30 are brought together into one external cooling-medium supply pipe 38A by a manifold 36A. The external cooling-medium supply pipe 38A extends to a position under the floor of the air-conditioned room 40 and is connected to a heat exchanger (not shown in the figure) installed outside the air-conditioned room 40. Moreover, the external cooling-medium pipes 32B and 34B (corresponding to the external cooling-medium pipe 18B of FIG. 3) through which the external cooling-medium discharged from the electronic equipments 32 and 34 in the rack 30 flows are brought together into one external cooling-medium return pipe 38B by a manifold 36B. The external cooling-medium return pipe 38B extends to a position under the floor of the air-conditioned room 40 and is connected to a heat exchanger (not shown in the figure) installed outside the air-conditioning room 40.

By constituting as mentioned above, the external cooling-medium, which absorbed the heat generated inside the electronic equipments 32 and 34 through the internal cooling-medium, is transported to the heat exchanger outside the air-conditioned room 40 through the external cooling-medium return pipe 38B, and turned to be at a low temperature by radiating the heat at the heat exchanger, and is supplied to the electronic equipments 32 and 34 through the external cooling-medium supply pipe 38A. Therefore, the heat generated inside the electronic equipments 32 and 34 can be transported out of the air-conditioned room 40 through the external cooling-medium, and can be radiated by the heat exchanger outside the air-conditioned room 40.

For this reason, the heat radiated into the air-conditioned room 40 is only the heat radiated from the electronic equipment 32 and the second heat exchanger in 34 (corresponding to the second heat exchanger 10 of FIG. 3), and can reduce the load to the air-conditioning machine 42 of the air-conditioned room 40. For example, even if a large number of the electronic equipments 32 and 34 accommodated in a large number of the racks 30 are operated at the same time, heat radiated into the air-conditioned room 40 can be reduced by performing cooling according to the external cooling-medium. Accordingly, the load to the air-conditioning machine 42 can be reduced, and the temperature in the air-conditioned room 40 can always be maintained constant. Moreover, if a heat spot is generated due to a large amount of heat generated in an area of a part of the air-conditioned room 40, the generation of the heat spot can be suppressed by making the cooling by the external cooling-medium stronger with respect to the electronic equipments located in that area. The efficiency of the air-conditioning machine can be raised by uniformizing the heat-generating density of the whole air-conditioned room.

Figure 5:
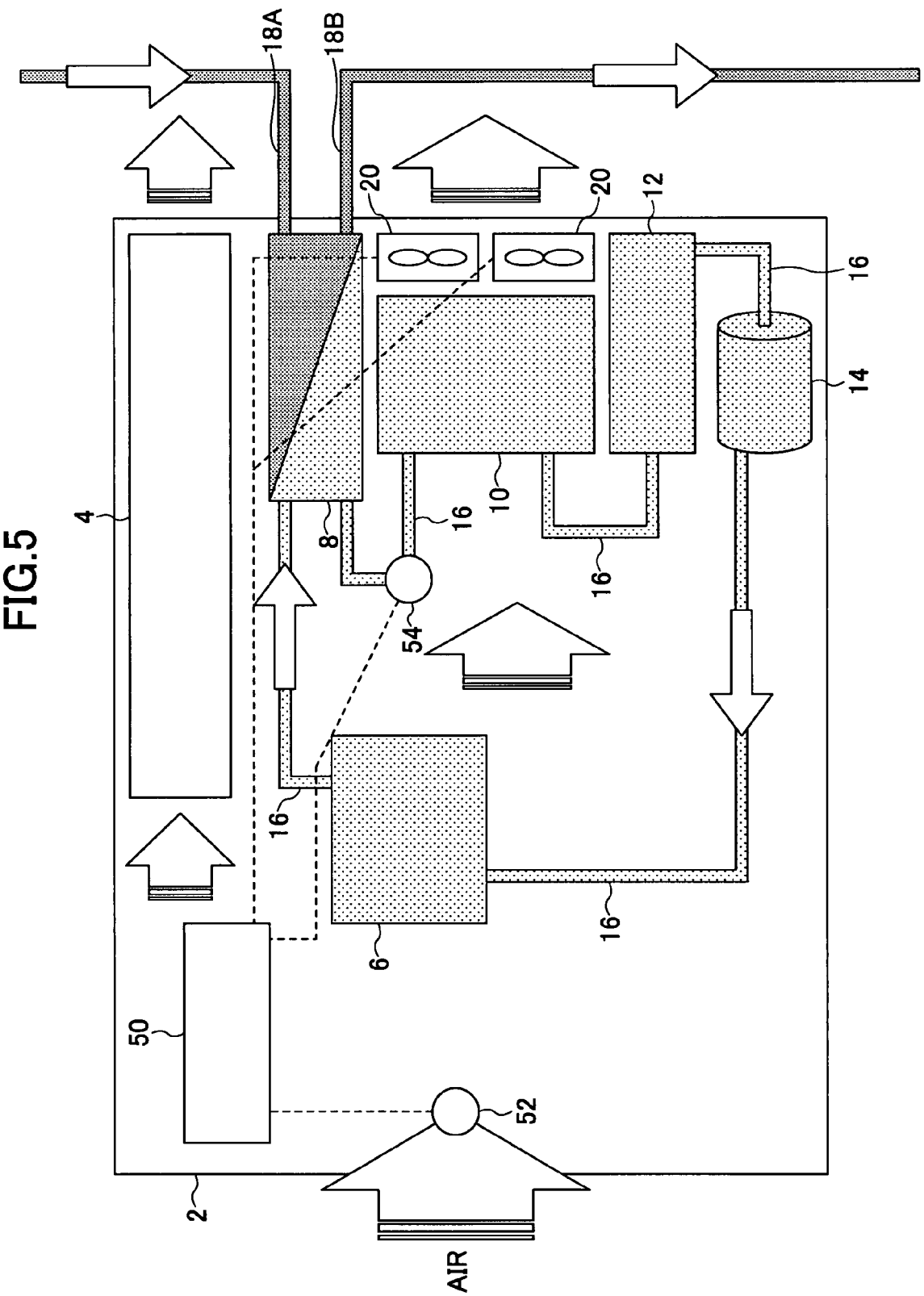
FIG. 5 is a plan view showing an outline of an electronic equipment according to a second embodiment of the present invention.

A description will now be given, with reference to FIG. 5, of an electronic equipment according to a second embodiment of the present invention. FIG. 5 is a plan view showing an outline of the electronic equipment according to the second embodiment of the present invention. In FIG. 5, parts that are the same as the parts shown in FIG. 3 are given the same reference numerals, and descriptions thereof will be omitted. The electronic equipment according to the second embodiment of the present invention has basically the same structure as the electronic equipment according to the first embodiment of the present invention shown in FIG. 3 except for a control part 50 and sensors 52 and 54 being provided in the present embodiment.

The air temperature sensor (air temperature detector) 52 is provided neat an air inlet opening of the housing 2 so as to detect a temperature of air flowing into the housing 2 from outside, and generates an air-temperature detection signal based on the detected temperature. The air temperature detection signal is sent to the control part 50.

The cooling-medium temperature sensor (cooling-medium temperature detector) 54 is provided in the middle of the pipe 16 so as to detect a temperature of the internal cooling-medium flowing through the pipe 16, and generates the cooling-medium temperature detection signal based on the detected temperature. The cooling-medium temperature detection signal is sent to the control part 50. In the present embodiment, the cooling-medium temperature sensor 54 is provided in the middle of the pipe 16, which connects the first heat exchanger 8 and the second heat exchanger 10 to each other so as to detect a temperature of the internal cooling-medium, which exited the first heat exchanger 8 and just before entering the second heat exchanger 10.

The control part 50 controls a rotation speed of the fan 20 as a blower based on the air-temperature detection signal from the air temperature sensor 52 and the cooling-medium temperature detection signal from the cooling-medium temperature sensor 54 so as to adjust an amount of air which passes the second heat exchanger 10 by adjusting to a necessary minimum amount of air flow. Thereby, energy consumption can be controlled without consuming unnecessary electric power by the fan, and a noise of the electronic equipment can be reduced.

In a case where the supply of the external cooling-medium is insufficient or a case where the external cooling-medium is supplied in accordance with conditions of the air-conditioned room and the air-conditioning machine, the heat radiation can be performed by the first and second heat exchangers 8 and 10 sharing the burden so that an electric power of the fan and the noise generated by the fan can be reduced by an amount corresponding to the heat radiation by the first heat exchanger 8. If a sufficient amount of external cooling-medium can be supplied and whole heat absorbed by the internal cooling-medium is radiated by the first heat exchanger, a noise generated from the electronic equipment can be reduced greatly by stopping the fan.

Figure 6:
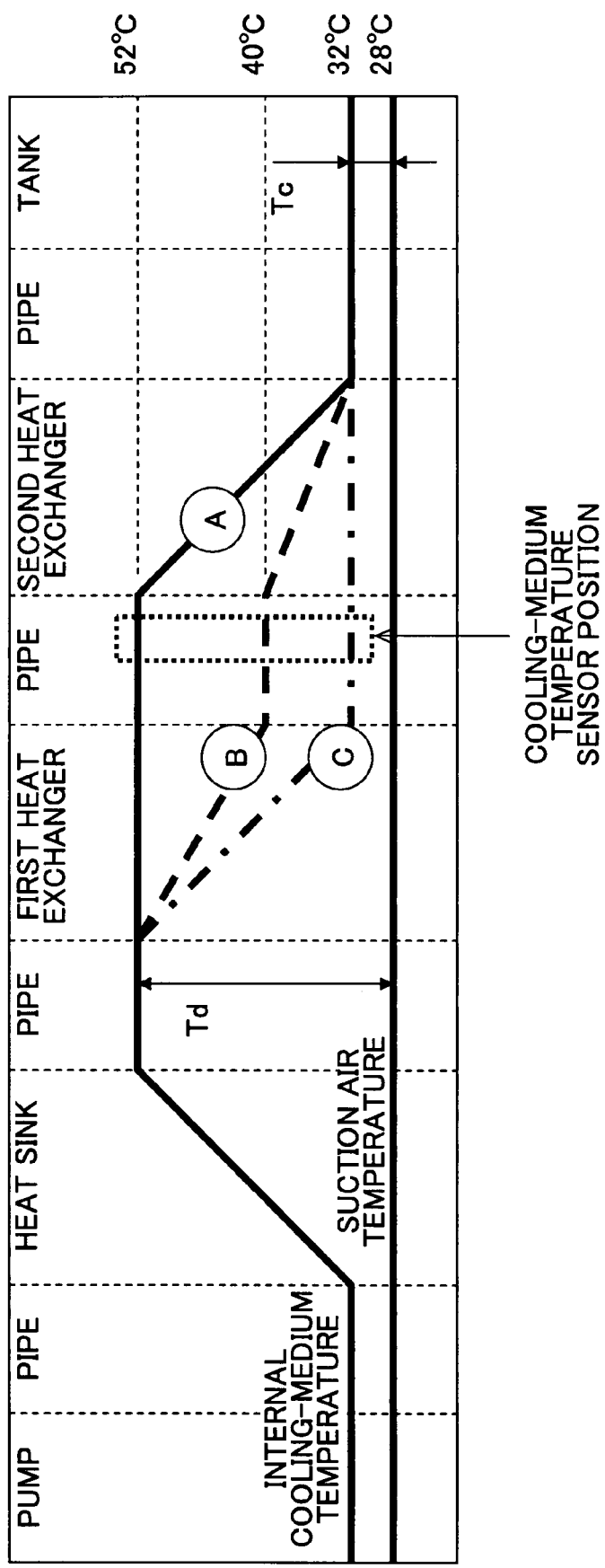
FIG. 6 is a graph showing a temperature along a cooling-medium circulation system.
Figure 7:
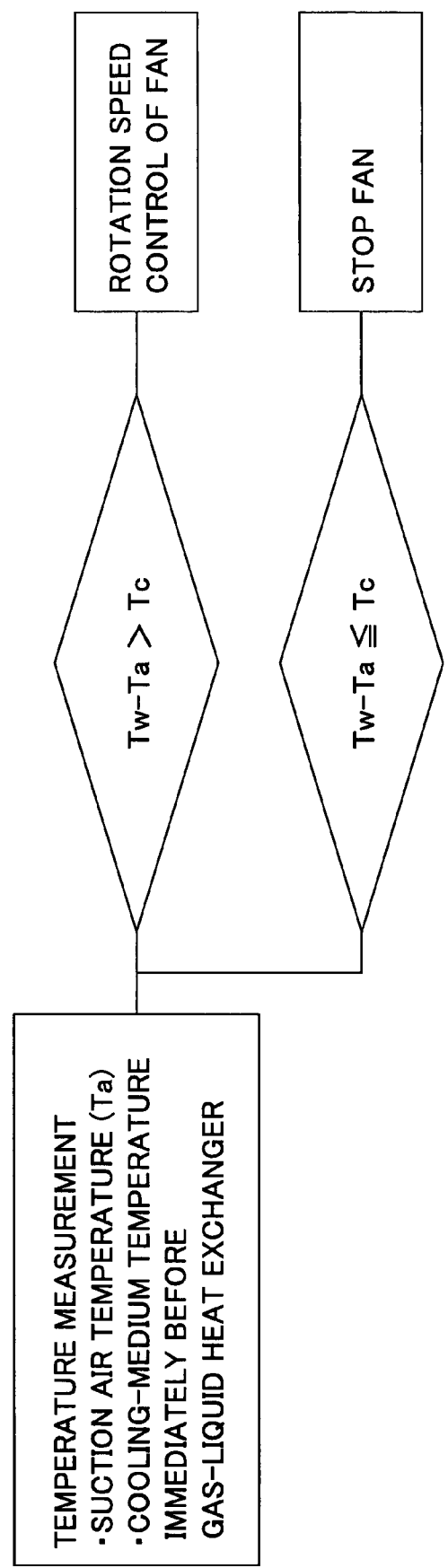
FIG. 7 is a diagram for explaining a drive control of a fan.

Here, a description will be give, with reference to FIG. 6 and FIG. 7, of an example of a control of the fan 20 by the control part 50. FIG. 6 is a graph showing temperatures of the internal cooling-medium along the cooling-medium circulation system. FIG. 7 is a diagram for explaining an example of a drive control of the fan.

Temperature changes in the following three cases are shown in FIG. 6.

A: Only air cooling.
B: Combined use of air-cooling and liquid-cooling by the external cooling-medium.
C: Only liquid-cooling by the external cooling-medium.

A is a case where cooling is performed by only the second heat exchanger 10 without using the first heat exchanger 8. That is, in the case of A, the supply of the external cooling-medium to the first heat exchanger 8 is stopped and the fan 20 is driven so as to cool the internal cooling-medium only by the heat exchange in the second heat exchanger 10.

B is a case where cooling is performed using both the first heat exchanger 8 and the second heat exchanger 10. That is, in the case of B, heat exchange is performed with the internal cooling-medium by the external cooling-medium being supplied to the first heat exchanger 8 and, simultaneously, heat exchange is performed in the second heat exchanger 10 so that the internal-cooling medium is cooled by both the first and second heat exchangers 8 and 10.

C is a case where heat exchange is performed by only the first heat exchanger 8 without using the second heat exchanger 10. That is, in the case of C, the drive of the fan 20 is stopped so as to stop the supply of air flow to the second heat exchanger 10 so that the internal cooling-medium is cooled by the heat exchange with the external cooling-medium in the first heat exchanger 8.

In the case of A, the temperature of the internal cooling-medium supplied from the pump 14 is, for example, 32° C. The temperature of the internal cooling-medium rises due to absorption of heat in the heat sink 6 and reaches, for example, 52° C. when exiting the heat sink 6. In the case of A, the temperature of the internal cooling-medium does not change in the first heat exchanger 8 since no heat exchanged is performed in the first heat exchanger 8. Thus, the internal cooling-medium passes through the first heat exchanger 8 without temperature change, and flows into the second heat exchanger 10 with the temperature of 52° C. The internal cooling-medium is cooled by the heat exchange in the second heat exchanger 10 and the temperature thereof is decreased to 32° C., and exits the second heat exchanger 10 and stored in the tank 12. In the case of A, cooling is performed only by the gas-liquid type second heat exchanger 10, and, thus, the cooling efficiency is lower than that of the cases D and C.

In the case of B, the temperature of the internal cooling-medium supplied from the pump 14 is, for example, 32° C. The temperature of the internal cooling-medium rises due to absorption of heat in the heat sink 6 and reaches, for example, 52° C. when exiting the heat sink 6. The internal cooling-medium flowing into the first heat exchanger 8 is cooled by heat exchange with the external cooling-medium in the first heat exchanger 8, and the temperature thereof is decreased to 40° C. Then, the internal cooling-medium of which temperature is 40° C. flows into the second heat exchanger 10. The internal cooling-medium is cooled by the heat exchange in the second heat exchanger 10 and the temperature thereof is decreased to 32° C., and exits the second heat exchanger 10 and stored in the tank 12. In the case of B, cooling is performed on the internal cooling-medium also by the liquid-liquid type heat exchanger 8 having a high cooling efficiency before cooling by the gas-liquid type second heat exchanger 10, and, thus, the cooling efficiency as a whole cooling-medium circulation system is higher than that of the case A.

In the case of C, the temperature of the internal cooling-medium supplied from the pump 14 is, for example, 32° C. The temperature of the internal cooling-medium rises due to absorption of heat in the heat sink 6 and reaches, for example, 52° C. when exiting the heat sink 6. The internal cooling-medium flowing into the first heat exchanger 8 is cooled by heat exchange with the external cooling-medium in the first heat exchanger 8, and the temperature thereof is decreased to 32° C. Accordingly, the temperature of the internal cooling-medium is sufficiently reduced, and there is no need to cool the internal cooling-medium in the second heat exchanger 10. Thus, the drive of the fan 20 is stopped, and the internal cooling-medium flows into the tank 12 with the temperature of 32° C. being maintained without being cooled by the second heat exchanger 10. In the case of C, the internal cooling-medium is cooled by the heat exchange of only the liquid-liquid type first heat exchanger 8 having a high cooling efficiency, and, thus, the cooling efficiency as the whole cooling-medium circulation system is higher than that of the cases A and B.

It should be noted that it is assumed in the above-mentioned cases A, B and C that the temperature (intake air temperature) Ta of the air taken into the housing 2 is 28° C.

In the present embodiment, while performing cooling in the electronic equipment efficiently, an amount of heat radiated to outside by the exhaust from the electronic equipment can be adjusted by the control part 50 controlling the drive of the fan 20 based on the intake air temperature detected by the above-mentioned air temperature detector 52 and the cooling-medium temperature detected by the cooling-medium temperature detector 54.

FIG. 7 is a diagram for explaining an example of a control of the drive of the fan 20. It is assumed that a temperature detected by the cooling-medium temperature detector 54 is Tw, and the intake air temperature detected by the air-temperature detector 52 is Ta. Additionally, a threshold value of a difference between a temperature of the internal cooling-medium in a cooled state and the intake air temperature Ta is Tc, and a difference between the temperature Tw (that is, the temperature of the internal cooling-medium between the first heat exchanger 8 and the second heat exchanger 10) detected by the cooling-medium temperature detector 54 and the intake air temperature Ta detected by the air-temperature detector 52 is Td.

If the difference Td between the temperature Tw of the internal cooling-medium and the intake air temperature Ta is equal to or smaller than the threshold value Tc of the difference between the temperature of the internal cooling-medium in a cooled state and the intake air temperature Ta (Tw−Ta=Td≦Tc), it is assumed that cooling by the second heat exchanger 10 is unnecessary and the drive of the fan 20 is stopped. On the other hand, if the difference Td between the temperature Tw of the internal cooling-medium and the intake air temperature Ta exceeds the threshold value Tc of the difference between the temperature of the internal cooling-medium in a cooled state and the intake air temperature Ta (Tw−Ta=Td>Tc), it is assumed that cooling by the second heat exchanger 10 is necessary and the fan 20 is driven. At this time, it is necessary to increase an amount of cooling by the second heat exchanger 10 as the temperature Tw of the internal cooling-medium immediately before the second heat exchanger 10 is increased. Thus, a rotation speed of the fan 20 is controlled so as to increase an amount of air flow by the fan 20.

Figure 8:
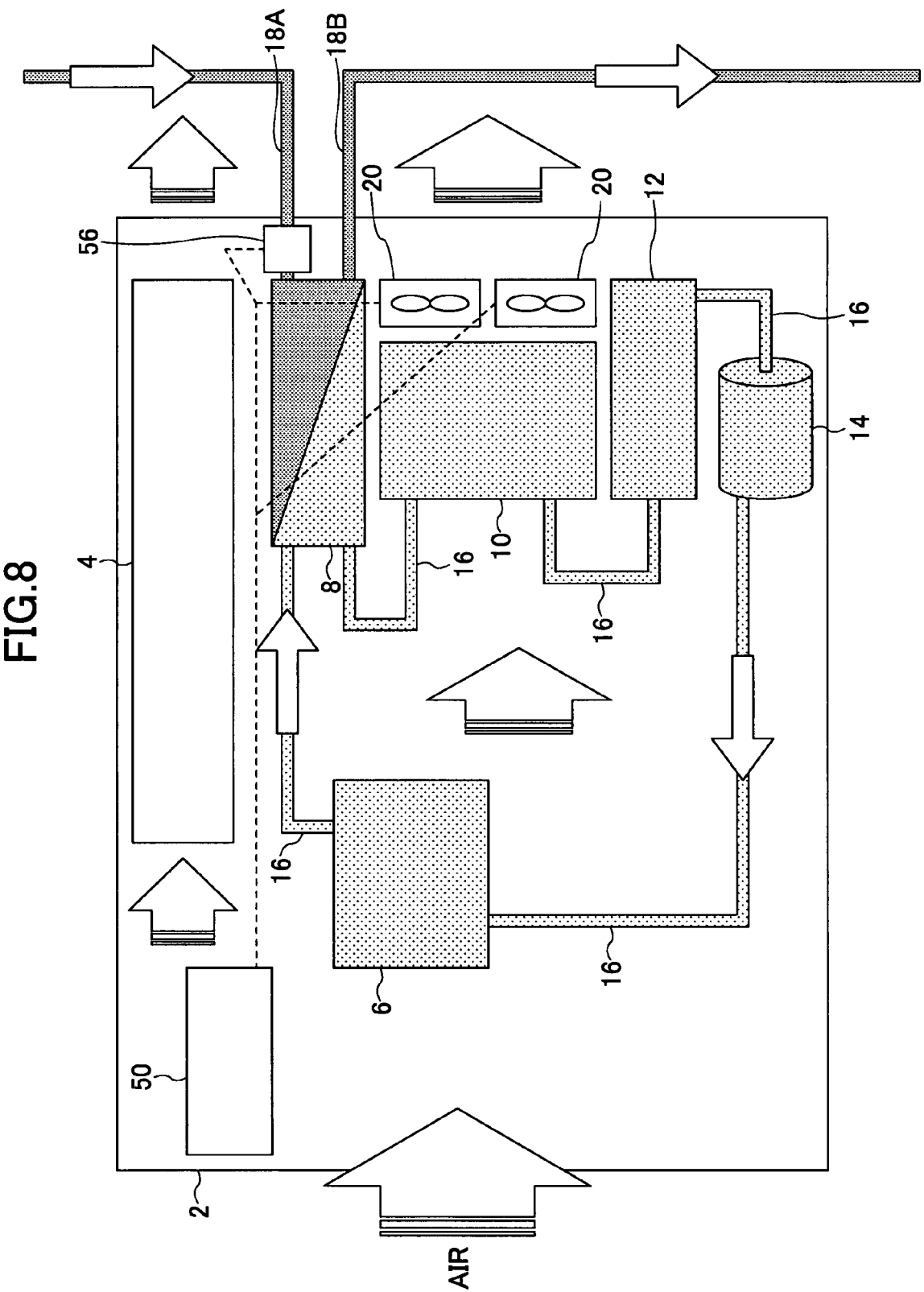
FIG. 8 is a plan view showing an outline of an electronic equipment according to a third embodiment of the present invention.

A description will now be given, with reference to FIG. 8, of an electronic equipment according to a third embodiment of the present invention. FIG. 8 is a plan view showing an outline of the electronic equipment according to the third embodiment of the present invention. In FIG. 8, parts that are the same as the parts shown in FIG. 3 are given the same reference numerals, and descriptions thereof will be omitted. The electronic equipment according to the third embodiment of the present invention has the same structure as the electronic equipment according to the first embodiment of the present invention shown in FIG. 3 except for a control part 50 and a flow meter 56 being provided in the present embodiment The flow meter 56 is provided to the external cooling-medium pipe 18A so as to detect an amount of flow of the external cooling medium supplied to the first heat exchanger 8, and generates a flow amount detection signal based on the detected amount of flow. The flow amount detection signal is sent to the control part 50.

The control part 50 acquires an amount of heat transferred from the internal cooling medium to the external cooling-medium in the first heat exchanger 8 based on the flow amount detection signal. Then, the control part 50 acquires an amount of heat to be absorbed from the internal cooling-medium by the second heat exchanger 10 based on the acquired amount of heat transferred, and determines a required amount of air flow of the fan 20 and controls the rotation speed of the fan 20. Accordingly, an amount of cooling by the second heat exchanger 10 can be controlled automatically base on an amount of flow of the external cooling-medium supplied to the electronic equipment. The rotation speed of the fan 20 may be controlled by providing an external cooling-medium temperature sensor (not shown in the figure) to detect an external cooling-medium temperature, if necessary, and sending a detection signal to the control part 50.

A description will be given below of other embodiments. Electronic equipments according to other embodiments of the present invention has basically the same structure as the electronic equipment according to the first embodiment of the present invention shown in FIG. 3, and a description will be give of different points. Additionally, in the figures showing the embodiments below, parts that are the same as the parts shown in FIG. 3 are given the same reference numerals, and descriptions thereof will be omitted.

Figure 9:
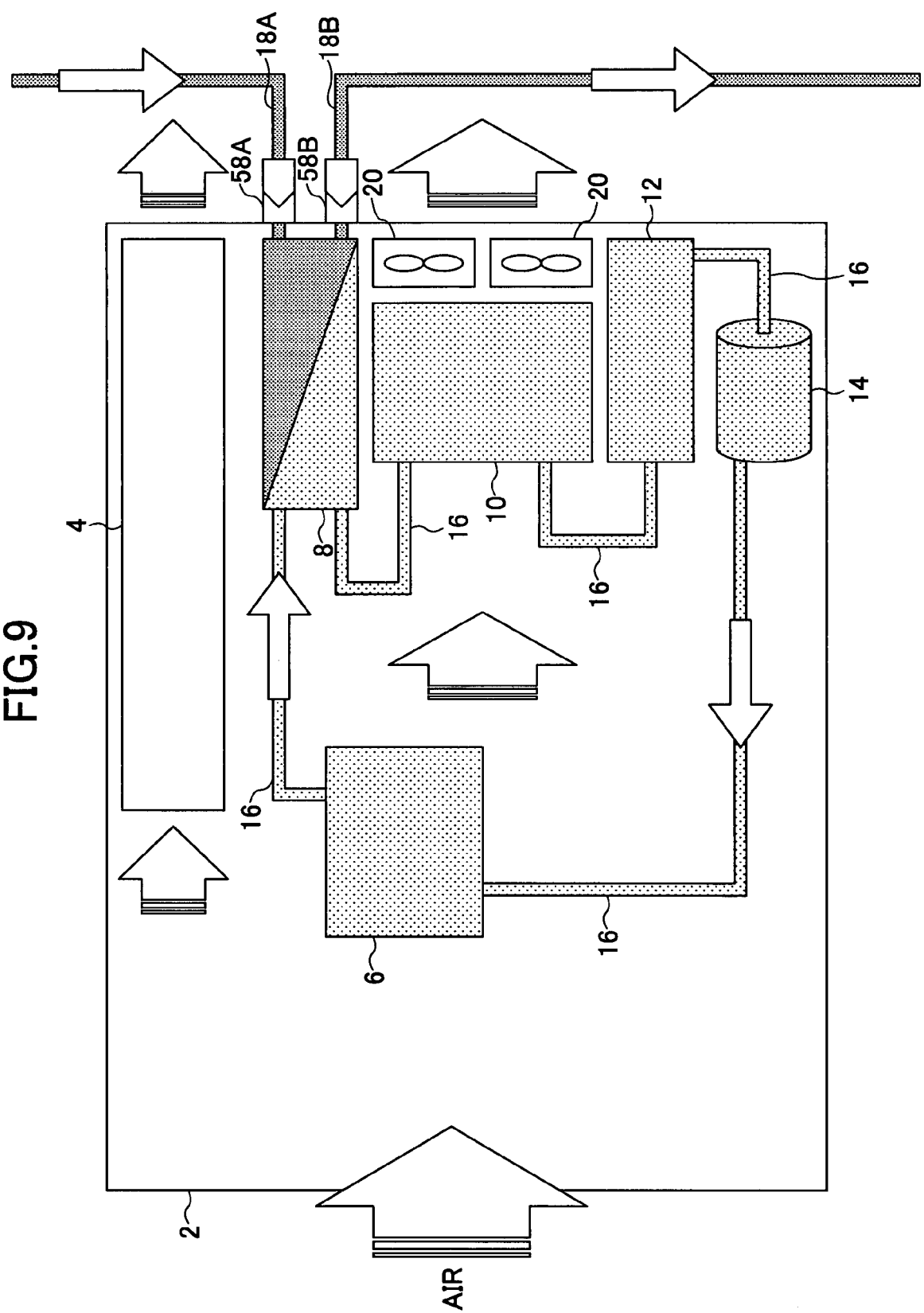
FIG. 9 is a plan view showing an outline of an electronic equipment according to a fourth embodiment of the present invention.

FIG. 9 is a plane view showing an outline of an electronic equipment according to a fourth embodiment of the present invention. The electronic equipment according to the fourth embodiment of the present invention is provided with fluid couplings 58A and 58B as pipe connectors between the first heat exchanger 10 and each of the external cooling-medium pipes 18A and 18B. The external cooling-medium can be supplied to the electronic equipment by connecting the fluid couplings 58A and 58B.

Although each of the fluid couplings 58A and 58B may be a screw joint, it is preferable to use a quick fluid coupling equipped with a valve, which can complete connection of fluid by merely inserting a plug into a socket. For example, a socket of each of the fluid couplings 58A and 58B is attached to the housing 2 of the electronic equipment and a plug is attached to an end of each of the external cooling-medium pipe 18A and 18B so that the external cooling-medium can be supplied to the first heat exchanger 8 and discharged from the first heat exchanger 8 by merely inserting the plugs at the ends of the external cooling-medium pipes 18A and 18B into the respective sockets of the housing 2 of the electronic equipment, if necessary. For example, if cooling of the electronic equipment is temporarily needed in emergency due to failure in the air-conditioning machine of the air-conditioned room, the electronic equipment can be cooled by the external cooling-medium by connecting the external cooling-medium pipes 18A and 18B. Moreover, if it is desirous to temporarily reduce a noise of the electronic equipment, it can be achieved by radiating a part of or whole heat by the first heat exchanger 8 and reducing a rotation speed of the fan 20 by easily connecting the external cooling-medium pipes 18A and 18B by providing the control part 50 and the cooling-medium temperature sensor 54 shown in FIG. 5.

Figure 10:
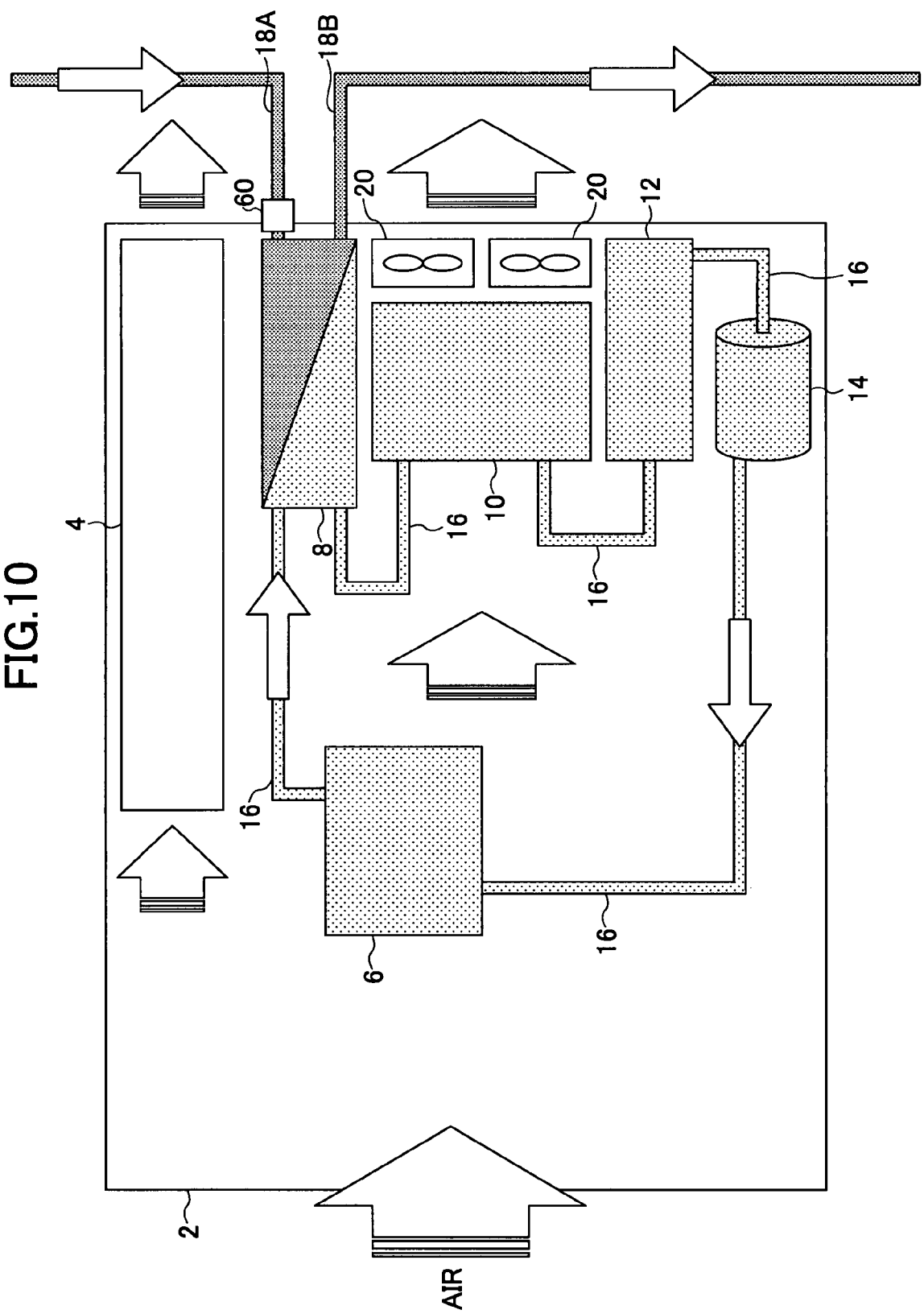
FIG. 10 is a plan view showing an outline of an electronic equipment according to a fifth embodiment of the present invention.

FIG. 10 is a plan view showing an outline of an electronic equipment according to a fifth embodiment of the present invention. The electronic equipment according to the fifth embodiment of the present invention is provided with an open and close valve or stop valve 60 to the external cooling-medium pipe 18A.

The open and close valve 60 is preferably attached to the housing 2 so that it can be easily operated from outside. The open and close valve 60 is opened when the external cooling-medium is needed, and is closed when the external cooling-medium is not needed so that the external cooling-medium can be supplied to the electronic equipment only when the external cooling-medium is needed. Additionally, if many electronic equipments are arranged, it is possible to easily perform an operation to supply the external cooling-medium to only some of the electronic equipments that actually requires cooling by the external cooling-medium.

Figure 11:
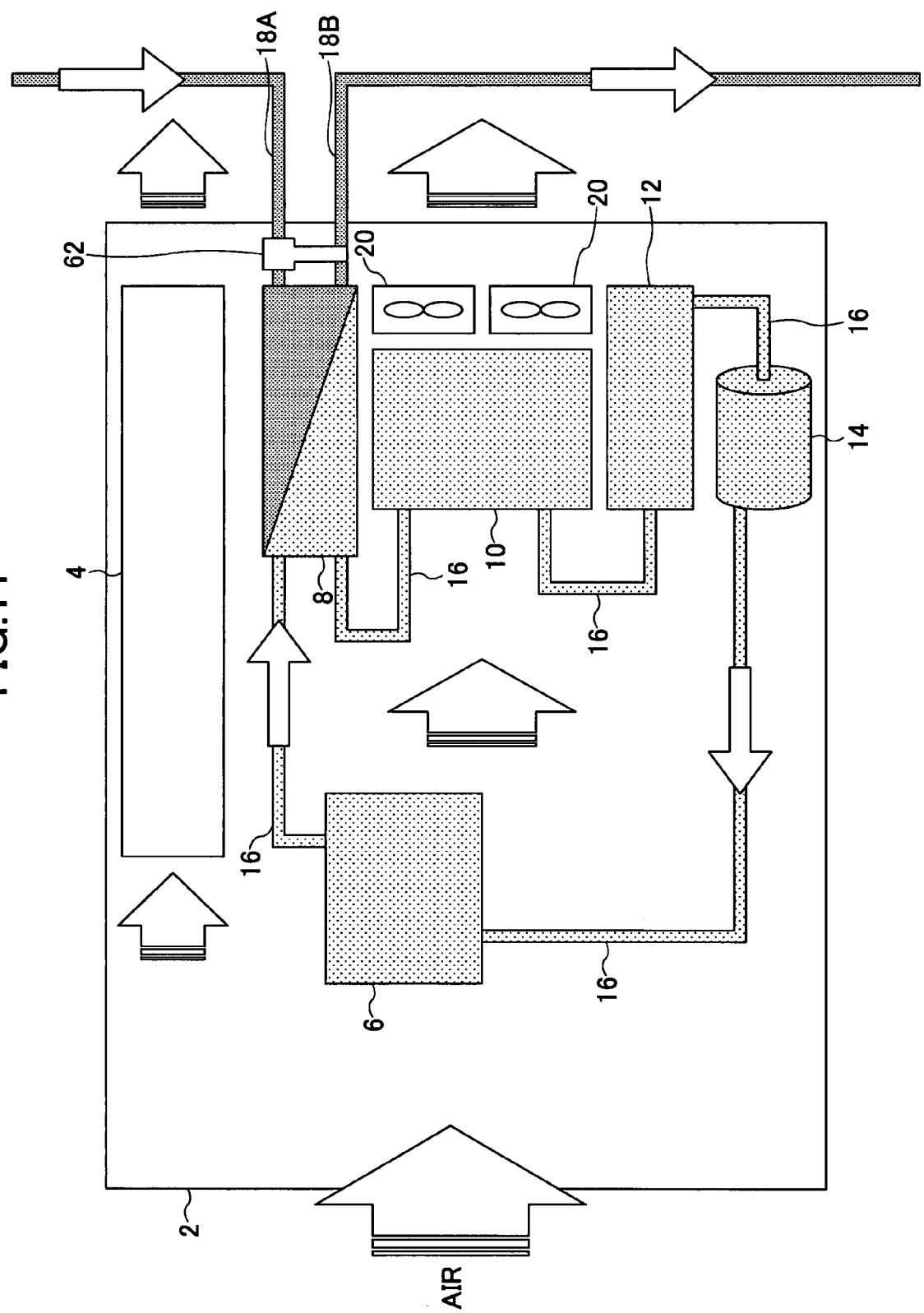
FIG. 11 is a plan view showing an outline of an electronic equipment according to a sixth embodiment of the present invention.

FIG. 11 is a plan view showing an outline of an electronic equipment according to sixth embodiment of the present invention. The electronic equipment according to the sixth embodiment of the present invention is provided with a relief valve 62 between the external cooling-medium pipe 18A and the external cooling-medium pipe 18B in the housing 2.

In the present embodiment, the relief valve 62 is provided so as to protect the first heat exchanger 8 in the electronic equipment when a cooling-medium pressure is suddenly raised in the external cooling-medium pipe 18A on the supply side. When a cooling-medium pressure is suddenly raised in the external cooling-medium pipe 18A on the supply side, a high pressure is also applied to the first heat exchanger 8, which may cause damage to the first heat exchanger 8. In such a situation, the relief valve 62 operates to relief the pressure of the external cooling-medium pipe 18A to the external cooling-medium pipe 18A on the discharge side. Thereby the pressure applied to the first heat exchanger 8 can be reduced, which prevents the first heat exchanger 8 and connection parts from being damaged.

The electronic equipment especially according to the present embodiment can make the external cooling-medium unnecessary by the equipment alone, and may not need to control a flow and a pressure of the external cooling-medium finely. Thus, it is highly possible that the pressure of the external cooling-medium goes up suddenly. It is effective for prevention of an accident to provide the relief valve 62.

Figure 12:
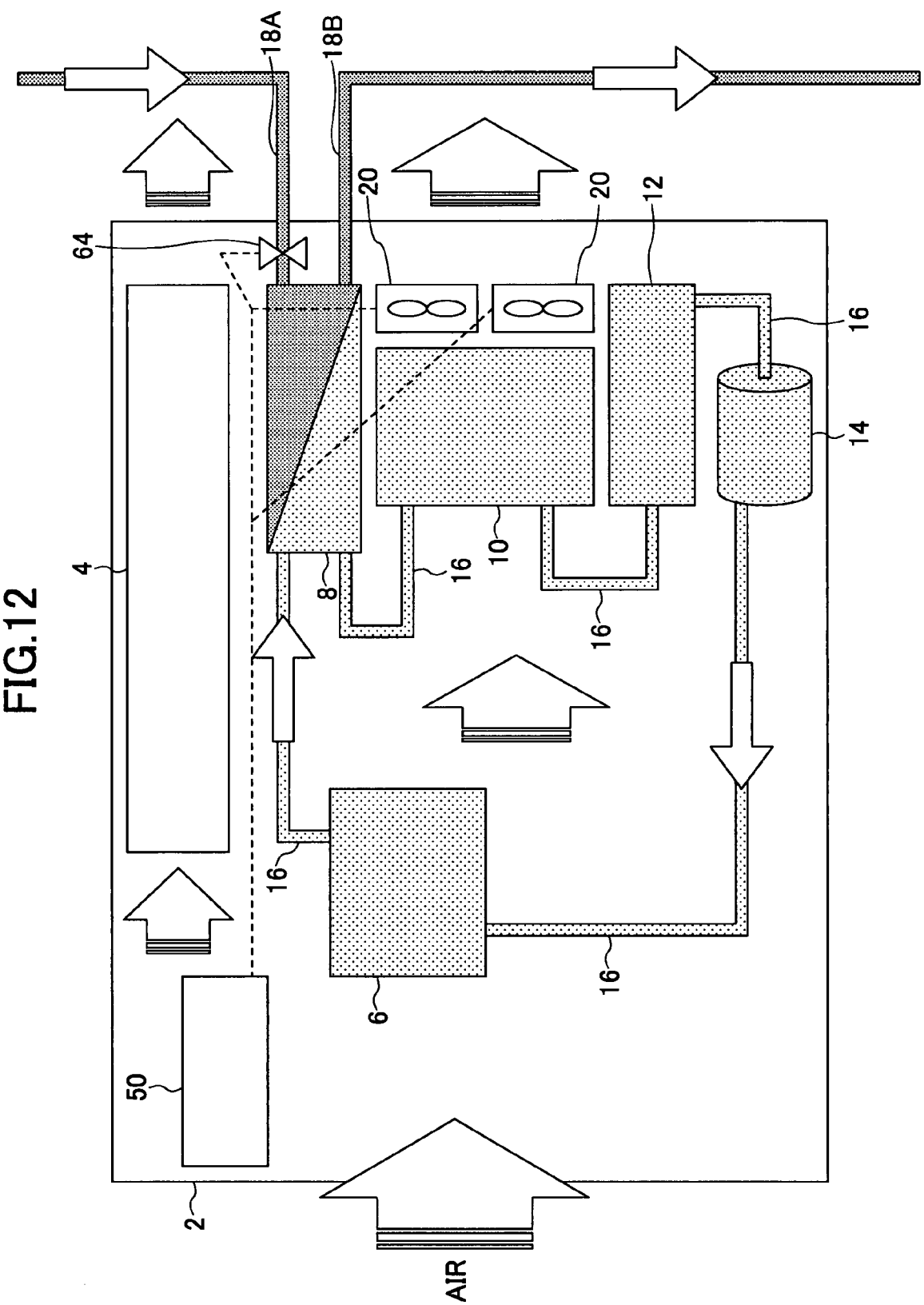
FIG. 12 is a plan view showing an outline of an electronic equipment according to a seventh embodiment of the present invention.

FIG. 12 is a plan view showing an outline of an electronic equipment according to the seventh embodiment. The electronic equipment according to the seventh embodiment of the present invention is provided with a control part 50 and an electromagnetic open and close valve 64.

The electromagnetic open and close valve 64 (solenoid valve) is provided to the external cooling-medium pipe 18A in the housing 2 so as to open or close according to an electric signal from the control part 50. By opening the electromagnetic open and close valve 64, the external cooling-medium is supplied to the first heat exchanger 8 from the external cooling-medium pipe 18A.

Since the opening and closing operation of the open and close valve 64 is controlled by the control part 50, it is possible to automatically perform a control such that, for example, when a power of the electronic equipment is turned on, the supply of the external cooling-medium is started by opening the electromagnetic open and close valve 64, and when a power is turned off, the supply of the external cooling-medium is stopped by closing the electromagnetic open and close valve 64.

Figure 13:
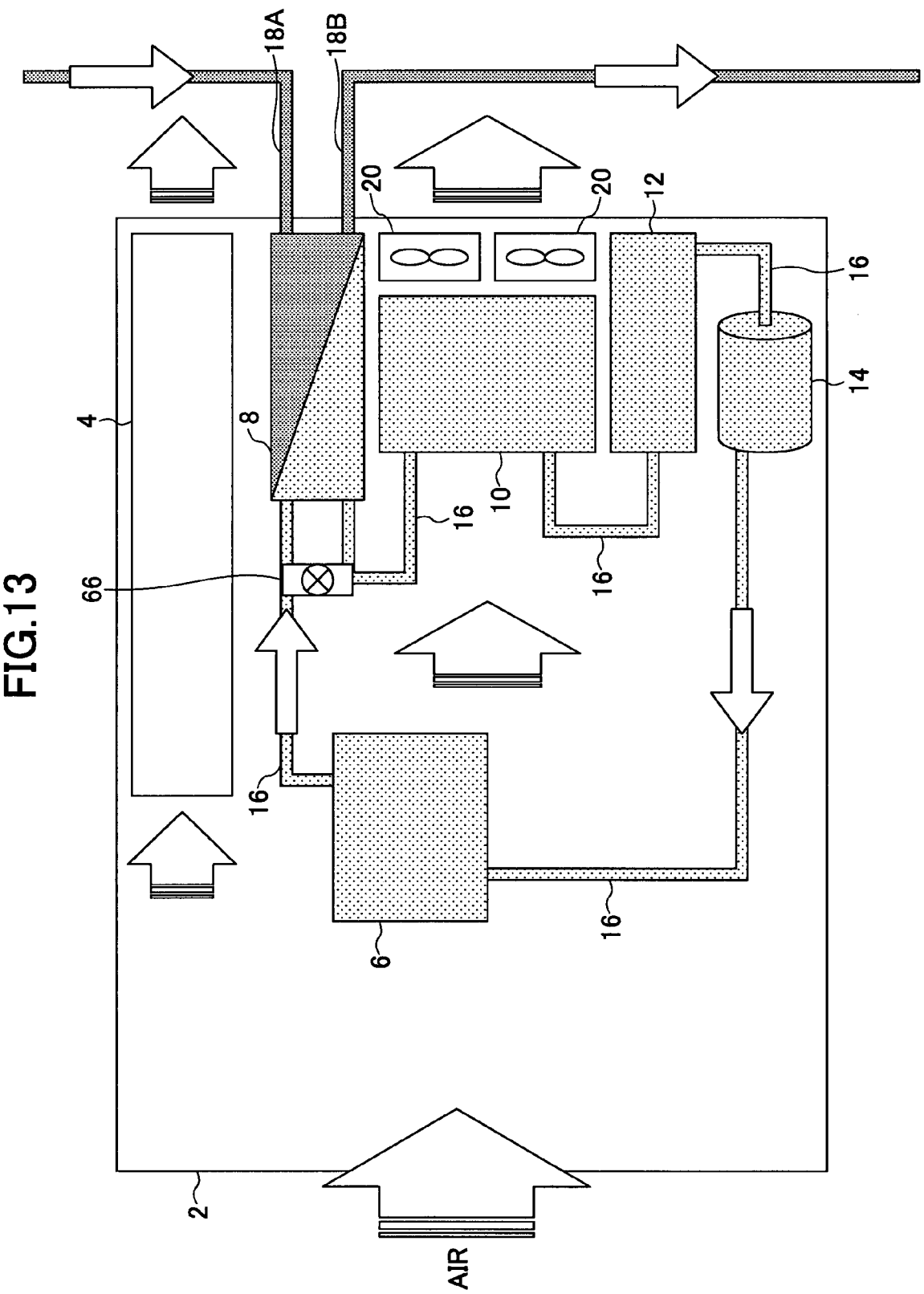
FIG. 13 is a plan view showing an outline of an electronic equipment according to an eighth embodiment of the present invention.

FIG. 13 is a plane view showing an outline of an electronic equipment according to an eighth embodiment of the present invention. The electronic equipment according to the eighth embodiment of the present invention is provided with a valve equipped short-circuit flow passage 66 is provided, which short-circuits the two pipes 16 connected to the first heat exchanger 8.

The valve equipped short-circuit flow passage 66 is a flow passage for short-circuiting between the pipe 16 for supplying the internal cooling-medium to the first heat exchanger 8 and the pipe 16 for discharging the internal cooling-medium from the first heat exchanger 8, the flow passage being opened or closed by the valve. For example, if a number of heat-generating parts in the electronic equipment is small and cooling by the external cooling-medium is not needed for a reason such that a number of option units mounted to the electronic equipment is small, the valve equipped short-circuit flow passage 66 is opened so that the internal cooling-medium does not flow through the first heat exchanger 8 but flows through the valve equipped short-circuit flow passage 66 and flows into the second heat exchanger 10. Thereby, a pressure loss of the internal cooling-medium due to passing the first heat exchanger 8 can be reduced, which reduces a load to the pump 14 for circulating the internal cooling-medium.

It should be noted that the load to the pump 14 can be controlled by detecting the temperatures of the heat-generating parts and internal cooling-medium and controlling an output of the pump 14 based on the detected temperatures. Thus, the output of the pump 14 can be reduced, if necessary. Such a control of the pump 14 can be applied to other embodiments.

Figure 14:
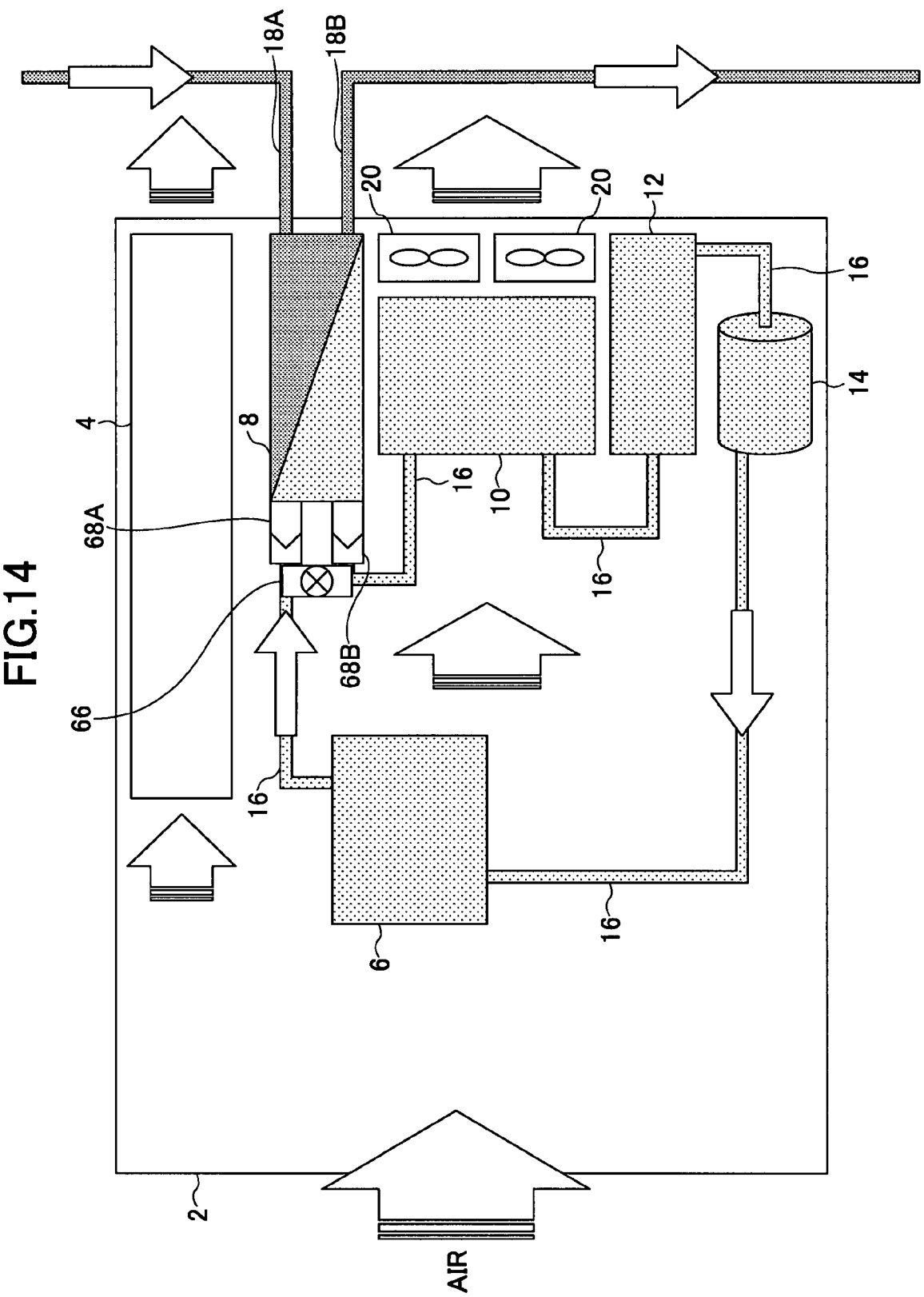
FIG. 14 is a plan view showing an outline of an electronic equipment according to a ninth embodiment of the present invention.

FIG. 14 is a plan view showing an outline of an electronic equipment according to a ninth embodiment of the present invention. The electronic equipment according to the ninth embodiment of the present invention corresponds to the electronic equipment according to the above-mentioned eighth embodiment provided with fluid couplings 68A and 68B for detachably connecting the first heat exchanger 8.

The fluid coupling 68A is provided between the first heat exchanger 8 and the pipe 16 for supplying the internal cooling-medium to the first heat exchanger 8, and the fluid coupling 68B is provided between the first heat exchanger 8 and the pipe 16 for discharging the internal cooling-medium from the first heat exchanger 8. Thus, the first heat exchanger 8 can be separated from the cooling-medium circulation system of the electronic equipment by disconnecting the fluid couplings 68A and 68B. In other words, the first heat exchanger 8 can be made as an option unit so that the first heat exchanger 8 is attached only when cooling by the external cooling-medium is needed.

For example, if the electronic equipment does not need cooling by the external cooling-medium, a selection of a configuration can be made that the first heat exchanger 8 is not incorporated initially so as to reduce a cost by not attaching an unnecessary part. It should be noted that if the first heat exchanger 8 is not incorporated into the electronic equipment initially, the valve (open and close valve constituting an open and close mechanism) of the valve equipped short-circuit flow passage 66 is opened. The valve of the valve equipped short-circuit flow passage 66 may be a manually operated valve, or may be an electromagnetic open and close valve (solenoid valve), which is controlled to open and close by the control part of the electronic equipment.

Figure 15:
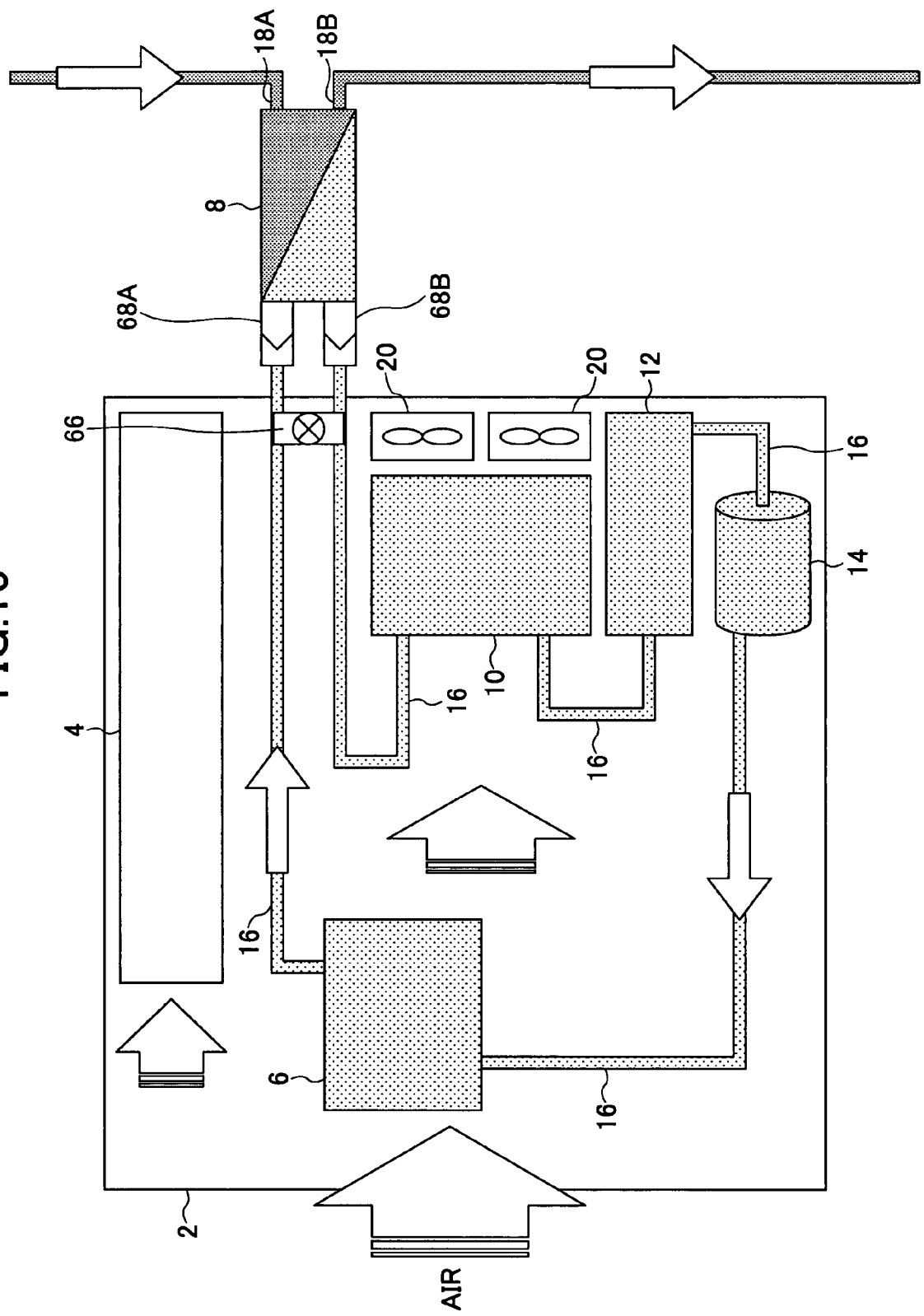
FIG. 15 is a plan view showing an outline of an electronic equipment according to a tenth embodiment of the present invention.

FIG. 15 is a plan view showing an outline of the electronic equipment according to a tenth embodiment of the present invention. The electronic equipment according to the tenth embodiment of the present invention is provided with the valve equipped short-circuit flow passage 66 and the first heat exchanger 8 is detachably arranged outside the housing 2. That is, the fluid couplings 68A and 68B, which can detachably connect the first heat exchanger 8, are provided outside the housing 2.

The fluid coupling 68A is provided on an extreme end of the pipe 16 for supplying the internal cooling-medium to the first heat exchanger 8, and the fluid coupling 68B is provided on an extreme end of the pipe 16 for discharging the internal cooling-medium from the first heat exchanger 8. Thereby, the first heat exchanger 8 can be incorporated into the cooling-medium circulation system inside the electronic equipment, only when the first heat exchanger 8 is needed, by connecting the first heat exchanger 8 by the fluid couplings 68A and 68B. When the first heat exchanger 8 is not needed, the first heat exchanger 8 is disconnected from the fluid couplings 68A and 68B, and, instead, the valve of the valve equipped short-circuit flow passage 66 is opened. As mentioned above, by configuring and arranging the first heat exchanger 8 to be detachably attached outside the housing 2, there is no need to provide a space for arranging the first heat exchanger 8 in the housing 2, and the housing 2 of the electronic equipment can be miniaturized correspondingly.

It should be noted that the detachable first heat exchanger 8 may be provided as a part of the rack apparatus in which electronic equipments are accommodated.

Figure 16:
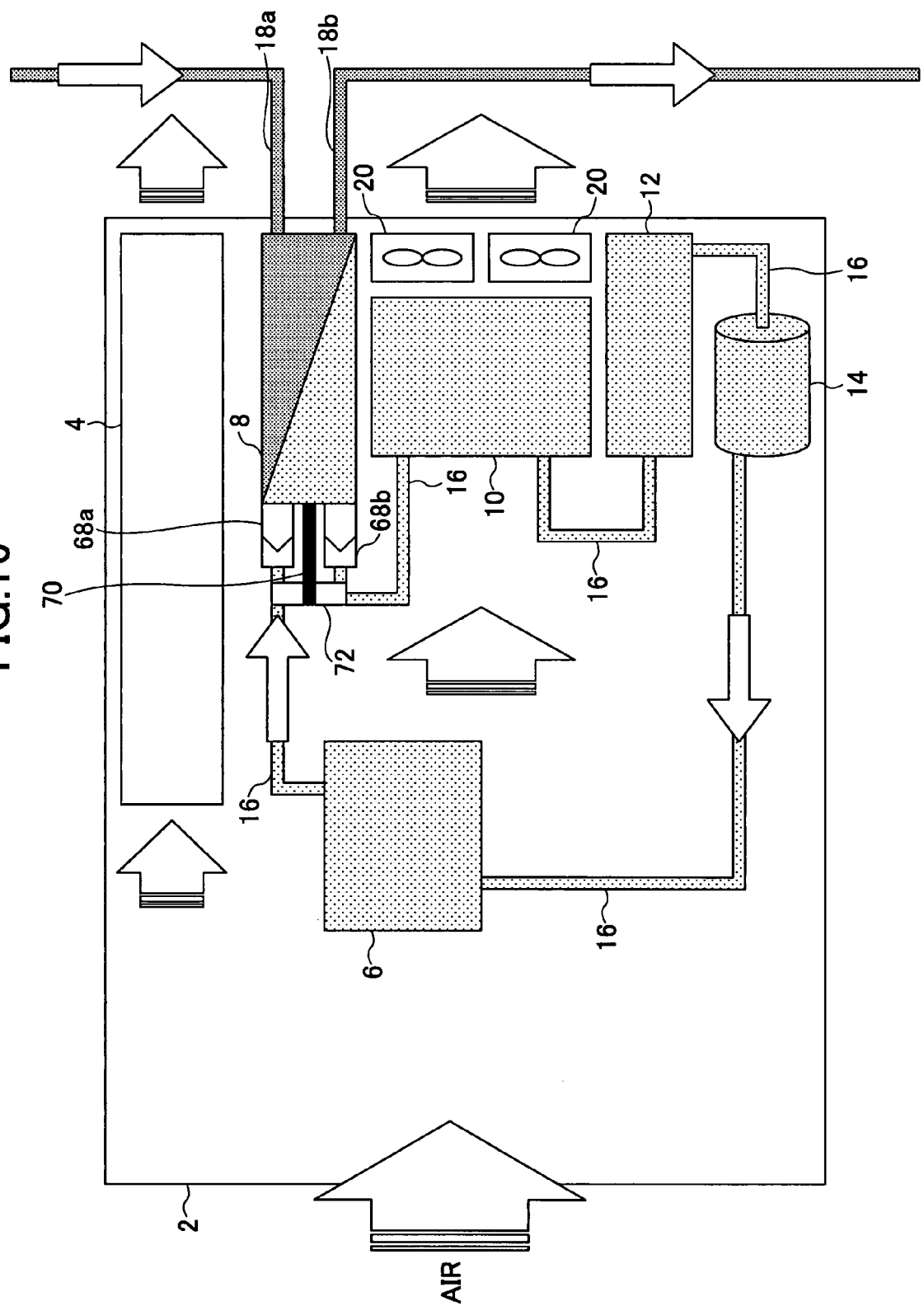
FIG. 16 is a plan view showing an outline of an electronic equipment according to an eleventh embodiment of the present invention.

FIG. 16 is a plan view showing an outline of an electronic equipment according to an eleventh embodiment of the present invention. The electronic equipment according to the eleventh embodiment of the present invention is provided with the fluid couplings 68A and 68B which detachably connect the first heat exchanger 8 and also provided with a short-circuit flow passage 72, which short-circuits the pipes 16 connected to the first heat exchanger 8 and a blocking mechanism 70 for blocking or shutting off the short-circuit flow passage 72.

Although the short-circuit flow passage 72 is a flow passage which short-circuits between the pipe 16 for supplying the internal cooling-medium to the first heat exchanger 8 and the pipe 16 for discharging the internal cooling-medium from the first heat exchanger 8, similar to the valve equipped short-circuit flow passage 66, an open and close valve is not incorporated in the short-circuit flow passage 72. Instead, the short-circuit flow passage 72 can be blocked or shut off by the blocking mechanism provided to the first heat exchanger 8.

Specifically, the short-circuit flow passage 72 is formed of, for example, an elastic tube such as rubber or plastics, and a plate-shaped blocking member for pressing and squashing the tube, is attached to the first heat exchanger 8. The blocking mechanism 70 is constituted by the blocking member and the elastic tube. When the first heat exchanger 8 is connected to the first fluid couplings 68A and 68B, the short-circuit flow passage 72 is blocked and shut off by the plate-shaped member being pressed onto the short-circuit flow passage 72 made of a tube having elasticity. When the first heat exchanger 8 is disconnected, the blocking member is also removed, which cancels the blocking of the tube and the short-circuit flow passage 72 is open and set in a short-circuiting state.

There may be various other mechanisms as the blocking mechanism for blocking the short-circuit flow passage 72 in association with attachment of the first heat exchanger 8. For example, there may be a structure in which a ball valve is incorporated into the short-circuit flow passage 72 so that a handle of the ball valve is rotated by the attachment of the first heat exchanger 8, which closes the ball valve.

The present invention is not limited to the specifically disclosed embodiments, and variations and modifications may be made without departing from the scope of the present invention.

The present application is based on Japanese priority application No. 2006-252938 file Sept. 19, 2006, the entire contents of which are hereby incorporated herein by reference.

What is claimed is:

1. An electronic equipment having a heat-generating part therein, the electronic equipment comprising:
    a housing accommodating component parts including the heat-generating part; and
    a cooling-medium circulation system for circulating a liquid internal cooling-medium between a heat-absorbing part and a heat-radiating part, the heat-absorbing part absorbing heat from said heat-generating part, the heat-radiating part radiating the heat absorbed by the heat-absorbing part,
    wherein said heat-radiating part of said cooling-medium circulation system includes:
    a first heat exchanger, which is a medium exchanging heat between a high temperature fluid and a low temperature fluid, the first heat exchanger performing heat exchange between a liquid external cooling-medium and said internal cooling-medium, the external cooling-medium being supplied from outside said electronic equipment;
    a second heat exchanger, which is a medium exchanging heat between a high temperature fluid and a low temperature fluid, the second heat exchanger performing heat exchange between an air and said internal cooling-medium, the air being exhausted from said housing to outside; and
    said first heat exchanger is separate from said second heat exchanger so that the cooling medium discharged from said first heat exchanger is supplied to said second heat exchanger.

2. The electronic equipment as claimed in claim 1, wherein a fan is provided in a vicinity of said second heat exchanger so that air inside said housing is exhausted to outside said housing by the fan.

3. The electronic equipment as claimed in claim 1, wherein said heat-absorbing part of said cooling-medium circulation system is a heat sink provided to said heat generating part.

4. The electronic equipment as claimed in claim 1, wherein said first heat exchanger is arranged along a path of said internal cooling-medium and between said heat-absorbing part and said second heat exchanger.

5. The electronic equipment as claimed in claim 1, further comprising:
- a fan arranged in a vicinity of said second heat exchanger so as to exhaust air inside said housing to outside said housing;
- an air-temperature detector detecting a temperature of the air inside said housing so as to generate an air-temperature detection signal;
- a cooling-medium temperature detector detecting a temperature of said internal cooling-medium of said cooling-medium circulation system so as to generated a cooling-medium temperature detection signal; and
- a control part controlling an amount of air flow of said fan based on said air-temperature detection signal and said cooling-medium temperature detection signal.

6. The electronic equipment as claimed in claim 5, wherein said control part controls the amount of air flow of said fan when a difference between a temperature of said internal cooling-medium at a position between said first heat exchanger and said second heat exchanger and a temperature detected by said air-temperature detector exceeds a predetermined threshold value, and said control part stops said fan when the difference is equal to or smaller than the threshold value.

7. The electronic equipment as claimed in claim 1, further comprising:
- a flow meter detecting an amount of flow of said external cooling-medium so as to generate a flow detection signal;
- a fan arranged in a vicinity of said second heat exchanger so as to exhaust the air inside said housing to outside said housing; and
- a control part controlling an amount of air flow of said fan based on said flow detection signal.

8. The electronic equipment as claimed in claim 1, wherein a fluid coupling is provided to an external cooling-medium pipe for supplying or discharging said external cooling-medium to or from said first heat exchanger.

9. The electronic equipment as claimed in claim 1, wherein an open and close valve is provided to an external cooling-medium pipe for supplying or discharging said external cooling-medium to or from said first heat exchanger.

10. The electronic equipment as claimed in claim 1, wherein a relief valve is provided between an external cooling-medium pipe for supplying said external cooling-medium to said first heat exchanger and an external cooling-medium pipe for discharging said external cooling-medium from said first heat exchanger.

11. The electronic equipment as claimed in claim 1, further comprising:
- an electromagnetic open and close valve provided to an external cooling-medium pipe for supplying or discharging said external cooling-medium to or from said first heat exchanger, and
- a control part controlling opening and closing of the electromagnetic open and close valve.

12. The electronic equipment as claimed in claim 1, wherein a short-circuit passage for short-circuiting between a pipe for supplying said internal cooling-medium to said first heat exchanger and a pip for discharging said internal cooling-medium from said first heat exchanger, and an open and close mechanism is provided to open and close the short-circuit passage.

13. The electronic equipment as claimed in claim 12, wherein said open and close mechanism includes an open and close valve incorporated in said short-circuit passage.

14. The electronic equipment as claimed in claim 13, wherein said open and close valve is an electromagnetic open and close valve.

15. The electronic equipment as claimed in claim 12, wherein said short-circuit passage has a tube having elasticity, and a blocking member is attached to said first heat exchanger, the blocking member configured to block off said short-circuit passage by pressing and squashing said tube.

16. The electronic equipment as claimed in claim 15, wherein said first heat exchanger is detachably attached using a fluid coupling.

17. The electronic equipment as claimed in claim 1, wherein said first heat exchanger is detachably attached using a fluid coupling.

18. A rack apparatus comprising:
- a rack; and
- at least one electronic equipment accommodated in said rack,
- wherein said electronic equipment has a heat-generating part therein and includes:
- a housing accommodating component parts including the heat-generating part; and
- a cooling-medium circulation system for circulating a liquid internal cooling-medium between a heat-absorbing part and a heat-radiating part, the heat absorbing part absorbing heat from said heat-generating part, the heat-radiating part radiating the heat absorbed by the heat-absorbing part,
- wherein said heat-radiating part of said cooling-medium circulation system includes:
- a first heat exchanger, which is a medium exchanging heat between a high temperature fluid and a low temperature fluid, the first heat exchanger performing heat exchange between a liquid external cooling-medium and said internal cooling-medium, the external cooling-medium being supplied from outside said electronic equipment;
- a second heat exchanger, which is a medium exchanging heat between a high temperature fluid and a low temperature fluid, the second heat exchanger performing heat exchange between an air and said internal cooling-medium, the air being exhausted from said housing to outside; and
- said first heat exchanger is separate from said second heat exchanger so that the cooling medium discharged from said first heat exchanger is supplied to said second heat exchanger.

19. A rack apparatus comprising:
- an electronic equipment having a heat-generating part therein; and
- a liquid-liquid type heat exchanger configured to be connectable to said electronic equipment, a liquid external cooling-medium being supplied from outside,
- wherein said electronic equipment includes:
- a housing accommodating component parts including the heat-generating part; and
- a cooling-medium circulation system for circulating a liquid internal cooling-medium between a heat-absorbing part and a heat-radiating part, the heat absorbing part absorbing heat from said heat-generating part, the heat-radiating part radiating the heat absorbed by the heat-absorbing part,
- wherein said heat-radiating part of said cooling-medium circulation system includes;
- a first heat exchanger, which is a medium exchanging heat between a high temperature fluid and a low temperature fluid, the first heat exchanger performing heat exchange between a liquid external cooling-medium and said internal cooling-medium, the external cooling-medium being supplied from outside said electronic equipment;

a second heat exchanger, which is a medium exchanging heat between a high temperature fluid and a low temperature fluid, the second heat exchanger performing heat exchange between an air and said internal cooling-medium, the air being exhausted from said housing to outside; and said first heat exchanger is separate from said second heat exchanger so that the cooling medium discharged from said first heat exchanger is supplied to said second heat exchanger.

* * * * *

UNITED STATES PATENT AND TRADEMARK OFFICE
CERTIFICATE OF CORRECTION

PATENT NO. : 7,522,418 B2
APPLICATION NO. : 11/878777
DATED : April 21, 2009
INVENTOR(S) : Junichi Ishimine It is certified that error appears in the above-identified patent and that said Letters Patent is hereby corrected as shown below:

Column 16, Line 63, change "heat generating" to --heat-generating--.

Column 17, Line 54, change "exchanger," to --exchanger;--.

Column 18, Line 63, change "includes;" to --includes:--.

Signed and Sealed this

First Day of September, 2009

David J. Kappos
*Director of the United States Patent and Trademark Office*